(12) United States Patent
Harada et al.

(10) Patent No.: US 10,395,947 B2
(45) Date of Patent: Aug. 27, 2019

(54) MANUFACTURING METHOD OF A RESIN MOLDED ARTICLE

(71) Applicant: DENSO CORPORATION, Kariya, Aichi-pref. (JP)

(72) Inventors: Tomoyuki Harada, Kariya (JP); Ryosuke Izumi, Kariya (JP); Hiroyuki Yamakawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 166 days.

(21) Appl. No.: 15/107,679

(22) PCT Filed: Feb. 23, 2015

(86) PCT No.: PCT/JP2015/000857
§ 371 (c)(1),
(2) Date: Jun. 23, 2016

(87) PCT Pub. No.: WO2015/129237
PCT Pub. Date: Sep. 3, 2015

(65) Prior Publication Data
US 2016/0336199 A1   Nov. 17, 2016

(30) Foreign Application Priority Data

Feb. 27, 2014 (JP) .................................. 2014-037230
Oct. 20, 2014 (JP) .................................. 2014-213682
Dec. 18, 2014 (JP) .................................. 2014-256397
Jan. 9, 2015 (JP) .................................. 2015-003417

(51) Int. Cl.
*B29C 45/14* (2006.01)
*H01L 21/56* (2006.01)
(Continued)

(52) U.S. Cl.
CPC ...... *H01L 21/565* (2013.01); *B29C 45/14311* (2013.01); *B29C 69/00* (2013.01); *H01L 21/268* (2013.01); *H01L 21/3105* (2013.01); *H01L 21/56* (2013.01); *H01L 23/293* (2013.01); *H01L 23/295* (2013.01); *H01L 23/3107* (2013.01);
(Continued)

(58) Field of Classification Search
None
See application file for complete search history.

(56) References Cited

U.S. PATENT DOCUMENTS 3,800,483 A * 4/1974 Sherman
4,643,944 A * 2/1987 Agethen et al.
(Continued)

FOREIGN PATENT DOCUMENTS

CN    1960605 A    5/2007
JP    H04-092459 A    3/1992
(Continued)

*Primary Examiner* — Edmund H Lee
(74) *Attorney, Agent, or Firm* — Posz Law Group, PLC

(57) ABSTRACT

A surface boundary is formed between a sealed surface of a thermosetting resin member and a thermoplastic resin member to seal the sealed surface. A newly formed surface is formed at the surface boundary by removing a surface layer in the sealed surface. A functional group in the newly formed surface is chemically bound to a functional group in a functional group-containing additive added to a constituent material of the thermoplastic resin member.

7 Claims, 21 Drawing Sheets

(51) Int. Cl.
B29C 69/00 (2006.01)
H01L 23/29 (2006.01)
H01L 23/31 (2006.01)
H01L 21/268 (2006.01)
H01L 21/3105 (2006.01)
B29K 63/00 (2006.01)
B29K 67/00 (2006.01)
B29K 81/00 (2006.01)
B29K 105/16 (2006.01)
B29K 509/02 (2006.01)
B29L 31/34 (2006.01)
H01L 23/00 (2006.01)

(52) U.S. Cl.
CPC ...... *H01L 23/3135* (2013.01); *H01L 23/3142* (2013.01); *B29C 45/14655* (2013.01); *B29K 2063/00* (2013.01); *B29K 2067/006* (2013.01); *B29K 2081/04* (2013.01); *B29K 2105/16* (2013.01); *B29K 2509/02* (2013.01); *B29K 2995/0007* (2013.01); *B29L 2031/3406* (2013.01); *H01L 24/45* (2013.01); *H01L 24/48* (2013.01); *H01L 2224/45124* (2013.01); *H01L 2224/45144* (2013.01); *H01L 2224/48091* (2013.01); *H01L 2224/48177* (2013.01); *H01L 2224/48247* (2013.01); *H01L 2924/00014* (2013.01); *H01L 2924/01013* (2013.01); *H01L 2924/01029* (2013.01); *H01L 2924/181* (2013.01); *H01L 2924/1815* (2013.01)

(56) References Cited

U.S. PATENT DOCUMENTS

| | | | |
|---|---|---|---|
| 5,948,991 | A | 9/1999 | Nomura et al. |
| 6,507,092 | B1 | 1/2003 | Fukasawa et al. |
| 9,789,637 | B2 * | 10/2017 | Izumi ................. B29C 45/1671 |
| 2003/0052396 | A1 | 3/2003 | Tajima et al. |
| 2003/0171001 | A1 | 9/2003 | Shinohara |
| 2009/0023253 | A1 | 1/2009 | Tajima et al. |
| 2010/0230696 | A1 | 9/2010 | Fukunaga |
| 2010/0258544 | A1 | 10/2010 | Kurita et al. |
| 2011/0169033 | A1 | 7/2011 | Fukunaga et al. |
| 2014/0295187 | A1 * | 10/2014 | Jacobsen et al. |
| 2015/0104657 | A1 | 4/2015 | Fukunaga et al. |
| 2015/0158221 | A1 | 6/2015 | Izumi et al. |

FOREIGN PATENT DOCUMENTS

| | | |
|---|---|---|
| JP | 09-162330 A | 6/1997 |
| JP | 2002-326220 A | 11/2002 |
| JP | 2002-329815 A | 11/2002 |
| JP | 2003-326601 A | 11/2003 |
| JP | 2005-007729 A | 1/2005 |
| JP | 2008-311366 A | 12/2008 |
| JP | 2010-071723 A | 4/2010 |
| JP | 2010-153632 A | 7/2010 |
| JP | 2013-207141 A | 10/2013 |
| JP | 2013-258354 A | 12/2013 |
| JP | 2016-014555 A | 1/2016 |
| WO | 2015/129236 A1 | 9/2015 |

* cited by examiner

MANUFACTURING METHOD OF A RESIN MOLDED ARTICLE

CROSS REFERENCE TO RELATED APPLICATIONS

This disclosure is a U.S. national stage application of International Patent Application No. PCT/JP2015/000857 filed on Feb. 23, 2015 and is based on Japanese Patent Application No. 2014-37230 filed on Feb. 27, 2014, Japanese Patent Application No. 2014-213682 filed on Oct. 20, 2014, Japanese Patent Application No. 2014-256397 filed on Dec. 18, 2014, and Japanese Patent Applications No. 2015-3417 filed on Jan. 9, 2015, the descriptions of which are incorporated herein by reference.

TECHNICAL FIELD

The present disclosure relates to a resin molded article and a method of manufacturing the resin molded article by partially sealing the surface of a thermosetting resin member with a thermoplastic resin member and exposing a remaining part of the surface of the thermosetting resin member from the thermoplastic resin member.

BACKGROUND

As a prior art technology, patent literature 1 proposes the resin molded article including a thermosetting resin member made of thermosetting resin sealed with a thermoplastic resin member made of thermoplastic resin. The resin molded article is configured so that the thermosetting resin member is entirely sealed with the thermoplastic resin member.

The thermosetting resin member needs to be partially exposed from the thermoplastic resin member depending on the usage or the structure of a molded article in consideration of a member shape, a detection form, and a force applied to the thermosetting resin member.

Patent literature 2 proposes the resin molded article as follows. The thermosetting resin member made of thermosetting resin seals a sealed component including a substrate where parts are mounted. The thermoplastic resin member made of thermoplastic resin seals the surface of the thermosetting resin member. The thermoplastic resin member seals a sealed surface as part of the surface of the thermosetting resin member and exposes an exposed surface as a remaining part of the surface.

The resin molded article takes advantage of the thermosetting resin and the thermoplastic resin. The thermosetting resin is characterized by high adhesion or low stress on the sealed component. The thermoplastic resin is characterized by measurement accuracy or toughness of a molded product. For example, the thermosetting resin is available as epoxy resin. The thermoplastic resin is available as PPS (polyphenylene sulfide) or PBT (polybutylene terephthalate).

An ordinary method of manufacturing the resin molded article is as follows. A sealed component is coated with a thermosetting resin material as a raw material for a thermosetting resin member. A hardening mold process, namely primary molding, is performed to heat and completely harden the sealed component and form the thermosetting resin member.

Then, a plasticizing mold process, namely secondary molding, is performed to form the thermoplastic resin member. Specifically, injection molding is performed so that the sealed component of the surface of the thermosetting resin member is coated with a thermoplastic resin material as a raw material for the thermoplastic resin member and heated. The resin molded article is thus fabricated.

PATENT LITERATURE

[Patent Literature 1] JP 2003-094479 A (JP 4620303 B2)
[Patent Literature 2] JP H10-170379 A (JP 3620184 B2)

SUMMARY (First Consideration)

This resin molded article uses the thermosetting resin member that is partially exposed from the thermoplastic resin member. The thermoplastic resin poorly adheres to the thermosetting resin, easily causing separation at the surface boundary between the thermosetting resin member and the thermoplastic resin member.

In this type of resin molded article, as described, the sealed surface as part of the surface of the thermosetting resin member is sealed with the thermoplastic resin member. The exposed surface as a remaining part of the surface is exposed from the thermoplastic resin member.

If separation occurs at the surface boundary, external moisture or contaminants penetrate into the resin molded article along the surface boundary from externally exposed part of the surface boundary, or, from the end of the surface boundary corresponding to the boundary between the sealed surface and the exposed surface in the thermosetting resin member.

In consideration of separation at the surface boundary, patent literature 2 applies another filled material to the end of the surface boundary corresponding to the boundary between the sealed surface and the exposed surface after a thermoplastic mold process to coat the end of the surface boundary and prevent the separation at the surface boundary. In this case, however, an additional filled material is needed, requiring improvement in restrictions on shapes of the resin molded article or increased costs.

A first object of the present disclosure has been made in view of the first consideration. It is the first object of the disclosure to improve adhesion between a thermosetting resin member and a thermoplastic resin member in a resin molded article containing the thermosetting resin member whose surface is partially sealed with the thermoplastic resin member.

To achieve the first object, a first aspect of the disclosure provides a manufacturing method of a resin molded article including: a thermosetting resin member made of thermosetting resin; and a thermoplastic resin member made of thermoplastic resin to seal a sealed surface as part of a surface of the thermosetting resin member. An exposed surface as a remaining part of the surface of the thermosetting resin member is exposed from the thermoplastic resin member. The manufacturing method includes processes described below.

In the manufacturing method, a hardening mold process uses a thermosetting resin material as a raw material for the thermosetting resin member, and heats and completely hardens the thermosetting resin material to form the thermosetting resin member. A surface layer removal process removes a surface layer on a topmost surface in at least part of the sealed surface of the thermosetting resin member and forms at least part of the sealed surface as a newly formed surface containing a functional group. A plasticizing mold process injection-molds a material serving as a thermoplastic resin material as a raw material for the thermoplastic resin member onto the thermosetting resin member formed with the newly formed surface. The material is doped with a functional group-containing additive containing a functional group chemically bound to the functional group on the newly formed surface. The plasticizing mold process seals the sealed surface of the thermosetting resin member with the thermoplastic resin member while chemically binding the functional group on the newly formed surface to the functional group in the functional group-containing additive doped with the thermoplastic resin material.

A contaminated object is removed from the sealed surface to form the newly formed surface at the surface boundary between the sealed surface of the thermosetting resin member and the thermoplastic resin member to seal the sealed surface. The newly formed surface allows functional groups to enable chemical binding between the thermosetting resin member and the thermoplastic resin member. The chemical binding provides high adhesion between the thermosetting resin member and the thermoplastic resin member. This can improve adhesion between the thermosetting resin member and the thermoplastic resin member.

To achieve the first object, a second aspect of the disclosure provides a resin molded article including: a thermosetting resin member made of thermosetting resin; and a thermoplastic resin member made of thermoplastic resin to seal a sealed surface as part of a surface of the thermosetting resin member. An exposed surface as a remaining part of the surface of the thermosetting resin member is exposed from the thermoplastic resin member. The thermoplastic resin member is doped with a functional group-containing additive containing a functional group. A roughened surface rougher than the exposed surface is formed on the sealed surface of the thermosetting resin member. A functional group on the roughened surface is chemically bound to the functional group in the functional group-containing additive.

The surface of the thermosetting resin member is formed into a roughened surface. A functional group in the roughened surface chemically binds to a functional group in the functional group-containing additive. Similarly to the first aspect, this can improve adhesion between the thermosetting resin member and the thermoplastic resin member.

To achieve the first object, a third aspect of the disclosure provides a manufacturing method of a resin molded article including: a thermosetting resin member made of thermosetting resin; and a thermoplastic resin member made of thermoplastic resin to seal a sealed surface as part of a surface of the thermosetting resin member. An exposed surface as a remaining part of the surface of the thermosetting resin member is exposed from the thermoplastic resin member. The manufacturing method further includes processes described below.

In the manufacturing method, a hardening mold process uses a thermosetting resin material as a raw material for the thermosetting resin member, and heats and completely hardens the thermosetting resin material to form the thermosetting resin member. A surface layer removal process removes a surface layer on a topmost surface in at least part of the sealed surface of the thermosetting resin member and forms at least part of the sealed surface as a newly formed surface containing a functional group. A plasticizing mold process injection-molds a material serving as a thermoplastic resin material as a raw material of the thermoplastic resin member onto the thermosetting resin member formed with the newly formed surface. The material is doped with a functional group-containing additive containing a functional group chemically bound to the functional group on the newly formed surface. The plasticizing mold process seals the sealed surface of the thermosetting resin member with the thermoplastic resin member while chemically binding the functional group on the newly formed surface to the functional group in the functional group-containing additive doped with the thermoplastic resin material. The hardening mold process dopes the thermosetting resin material with a catalyst that activates the functional group in the functional group-containing additive. The surface layer removal process exposes the catalyst from the newly formed surface.

A contaminated object is removed from the sealed surface to form the newly formed surface at the surface boundary between the sealed surface of the thermosetting resin member and the thermoplastic resin member to seal the sealed surface. The newly formed surface allows functional groups to enable chemical binding between the thermosetting resin member and the thermoplastic resin member. The chemical binding provides high adhesion between the thermosetting resin member and the thermoplastic resin member. This can improve adhesion between the thermosetting resin member and the thermoplastic resin member.

Moreover, the surface layer is removed from the thermosetting resin member to expose the catalyst from the newly formed surface. A functional group in the functional group-containing additive added to the thermoplastic resin member is furthermore activated and reacts with a functional group exposed from the newly formed surface of the thermosetting resin member to enable higher adhesion.

To achieve the first object, a fourth aspect of the disclosure provides a resin molded article including: a thermosetting resin member made of thermosetting resin; and a thermoplastic resin member made of thermoplastic resin to seal a sealed surface as part of a surface of the thermosetting resin member. An exposed surface as a remaining part of the surface of the thermosetting resin member is exposed from the thermoplastic resin member. The thermoplastic resin member is doped with a functional group-containing additive containing a functional group. The thermosetting resin member is doped with a catalyst to activate the functional group in the functional group-containing additive. The catalyst is exposed from the sealed surface of the thermosetting resin member by a surface removal portion formed by removing a surface layer from the thermosetting resin member. A functional group in the functional group-containing additive is activated to chemically bind to a functional group in the thermosetting resin member.

The surface removal portion is formed on the thermosetting resin member and the catalyst is exposed from the surface removal portion to activate a functional group in the functional group-containing additive. This structure can chemically bind a functional group in the activated functional group-containing additive to a functional group in the newly formed surface. This can improve adhesion between the thermosetting resin member and the thermoplastic resin member similarly to the third aspect.

(Second Consideration)

As described, the separation occurs at the surface boundary between the thermosetting resin member and the thermoplastic resin member in the configuration of allowing the thermoplastic resin member to partially seal the thermosetting resin member. A material such as external moisture may enter the inside of the resin molded article along the surface boundary. This partially sealed configuration is particularly requested to prevent the separation between both resin members.

The inventors formed: part of the sealed surface of the thermosetting resin member into a non-roughened surface to which no roughening process is applied; and the remaining part of the sealed surface into a roughened surface rougher than the non-roughened surface. The roughening process to form the roughened surface uses laser irradiation to remove a surface. The roughened surface is recessed to cause a level difference from the non-roughened surface.

The thermoplastic resin member is doped with an additive containing a functional group. The functional group in the additive is chemically bound to a functional group in the roughened surface. The chemical binding enables high adhesion between the thermosetting resin member and the thermoplastic resin member and therefore improves adhesion between the thermosetting resin member and the thermoplastic resin member.

Part of the sealed surface was formed into the non-roughened surface and the remaining part of the sealed surface was formed into the roughened surface instead of entirely forming the sealed surface of the thermosetting resin member into the roughened surface. This is because of roughening process costs or limitations on shapes of the thermosetting resin member to which the roughening process is applied.

In this case, suppose that separation occurs on the less adhesive non-roughened surface of the sealed surface sealed with the thermoplastic resin member and extends to a boundary between the roughened surface and the non-roughened surface. The separation may further induce separation on the roughened surface. To solve this, the inventors tried to prevent the separation at the boundary between the roughened surface and the non-roughened surface.

A second object of the present disclosure has been made in view of the first consideration. It is the second object of the disclosure to enable the partially sealed configuration to prevent separation from extending to the roughened surface at a boundary between the roughened surface and the non-roughened surface when the separation occurs on the non-roughened surface of the sealed surface of the thermosetting resin member.

To achieve the second object, a fifth aspect of the disclosure provides a resin molded article including: a thermosetting resin member made of thermosetting resin; and a thermoplastic resin member made of thermoplastic resin to seal a sealed surface as part of a surface of the thermosetting resin member. An exposed surface as a remaining part of the surface of the thermosetting resin member is exposed from the thermoplastic resin member. The resin molded article is provided as follows.

In the resin molded article, no roughening process is applied to part of the sealed surface of the thermosetting resin member to form a non-roughened surface. The remaining part of the sealed surface is depressed to be lower than the non-roughened surface to generate a level difference and is formed into a roughened surface rougher than the non-roughened surface. The thermoplastic resin member is doped with an additive containing a functional group to enable chemical binding between a functional group in the roughened surface and a functional group in the additive. A boundary between the non-roughened surface and the roughened surface of the sealed surface is provided with a groove to prevent separation from extending to the roughened surface while the separation occurs at a surface boundary between the non-roughened surface and the thermoplastic resin member.

According to the disclosure, the surface of the thermosetting resin member is formed into a roughened surface. A functional group in the roughened surface chemically binds to a functional group in the functional group-containing additive. This can improve adhesion between the thermosetting resin member and the thermoplastic resin member.

The groove bends the surface boundary between the sealed surface and the thermoplastic resin member at the boundary between the non-roughened surface and the roughened surface. The groove also bends an extension pathway of the separation to the roughened surface when the separation occurs at the surface boundary between the non-roughened surface and the thermoplastic resin member. This decreases a stress intensity factor concerning the separation. The groove increases a creepage distance between the non-roughened surface and the roughened surface. The aspect enables to prevent separation from extending to the roughened surface at a boundary between the roughened surface and the non-roughened surface when the separation occurs on the non-roughened surface of the sealed surface of the thermosetting resin member.

To achieve the second object, a sixth aspect of the disclosure provides a resin molded article including: a thermosetting resin member made of thermosetting resin; and a thermoplastic resin member made of thermoplastic resin to seal a sealed surface as part of a surface of the thermosetting resin member. An exposed surface as a remaining part of the surface of the thermosetting resin member is exposed from the thermoplastic resin member. The resin molded article is provided as follows.

In the resin molded article, no roughening process is applied to part of the sealed surface of the thermosetting resin member to form a non-roughened surface and the remaining part of the sealed surface is depressed to be lower than the non-roughened surface to generate a level difference and is formed into a roughened surface rougher than the non-roughened surface. The thermoplastic resin member is doped with an additive containing a functional group to enable chemical binding between a functional group in the roughened surface and a functional group in the additive.

The level difference is formed between the non-roughened surface and the roughened surface of the sealed surface and includes a wall surface to which an unevenness process is applied to prevent separation from extending to the roughened surface while the separation occurs at a surface boundary between the non-roughened surface and the thermoplastic resin member.

According to the disclosure, the surface of the thermosetting resin member is formed into a roughened surface. A functional group in the roughened surface chemically binds to a functional group in the functional group-containing additive. This can improve adhesion between the thermosetting resin member and the thermoplastic resin member.

Applying the unevenness process to the wall surface of the level difference increases a creepage distance between the non-roughened surface and the roughened surface and improves adhesion of the thermoplastic resin member at the level difference. The disclosure also enables to prevent separation from extending to the roughened surface at a boundary between the roughened surface and the non-roughened surface when the separation occurs on the non-roughened surface of the sealed surface of the thermosetting resin member.

(Third Consideration)

A manufacturing process to partially seal the thermosetting resin member with the thermoplastic resin member uses a die to mold the thermoplastic resin member. Normally, the die includes a molding portion and a fitting portion. The molding portion includes a cavity whose spatial configuration corresponds to an external shape of the thermoplastic resin member. The fitting portion is provided adjacently to the molding portion and is fit to the exposed surface of the thermosetting resin member. Namely, the fitting portion provides the die with a matching surface for the exposed surface of the thermosetting resin member.

The process positions the sealed surface of the thermosetting resin member in the cavity. The process injects the thermoplastic resin material into the cavity and fills the cavity with the thermoplastic resin material to form the thermoplastic resin member while the fitting portion is fit to the exposed surface of the thermosetting resin member. In this manner, the thermoplastic resin member seals the thermosetting resin member to form the resin molded article.

The process to mold the thermoplastic resin generates a gap between the exposed surface of the thermosetting resin member and the fitting portion of the die due to an opening or deformation of the die resulting from a design-time dimension tolerance or a resin pressure (i.e., injection pressure) during molding.

When the thermoplastic resin member is molded, the gap between the exposed surface and the fitting portion generates a resin burr made of the thermoplastic resin material. The thermoplastic resin member is partially pushed out of the boundary between the sealed surface and the exposed surface of the thermosetting resin member along the exposed surface to form the resin burr.

The resin burr is pushed out of the regular shape of the thermoplastic resin member and is formed into a thin fin and is easily lost. A prior art technology requires an additional process to remove the resin burr after the thermoplastic resin molding process.

A third object of the present disclosure has been made in view of the first consideration. It is the third object of the disclosure to prevent loss of the resin burr of the thermoplastic resin member to be formed at the boundary between the sealed surface and the exposed surface of the thermosetting resin member while eliminating the need for an additional process to remove the resin burr.

To achieve the third object, a seventh aspect of the disclosure provides a resin molded article including: a thermosetting resin member that is made of a thermosetting resin material and contains a sealed surface as part of a surface and an exposed surface as a remaining part of the same; and a thermoplastic resin member that is made of a thermoplastic resin material and seals the sealed surface so as to expose the exposed surface belonging to a surface of the thermosetting resin member. The thermoplastic resin member is partially pushed out along the exposed surface at a boundary between the sealed surface and the exposed surface of the thermosetting resin member to form the resin burr. A base of the resin burr at least on the exposed surface belonging to a surface of the thermosetting resin member is formed as a surface-processed portion to which surface treatment is applied to increase adhesiveness to the thermoplastic resin member compared to any other part of the surface except the base.

The resin molded article includes the surface-processed portion with improved adhesiveness to the thermoplastic resin member at the base of the resin burr on the exposed surface of the thermosetting resin member, namely, immediately below the resin burr. The resin molded article enables strong adhesiveness between the resin burr and the exposed surface. This configuration can prevent loss of the resin burr while eliminating the need for an additional process to remove the resin burr.

To achieve the third object, an eighth aspect of the disclosure provides a resin molded article manufacturing method to manufacture a resin molded article including: a thermosetting resin member that is made of a thermosetting resin material and contains a sealed surface as part of a surface and an exposed surface as a remaining part of the same; and a thermoplastic resin member that is made of a thermoplastic resin material and seals the sealed surface so as to expose the exposed surface belonging to a surface of the thermosetting resin member to form the resin burr. The thermoplastic resin member is partially pushed out along the exposed surface at a boundary between the sealed surface and the exposed surface of the thermosetting resin member. The resin molded article manufacturing method is configured as follows.

The manufacturing method includes a preparation process and a resin molding process. The preparation process prepares the thermosetting resin member. The resin molding process uses a die to form the thermoplastic resin member. The die includes a molding portion and a fitting portion. The molding portion includes a cavity whose spatial configuration corresponds to an external shape of the thermoplastic resin member. The fitting portion is provided adjacently to the molding portion and is fit to the exposed surface of the thermosetting resin member. The resin molding process positions the sealed surface of the thermosetting resin member in the cavity, injects the thermoplastic resin material into the cavity, and fills the cavity with the thermoplastic resin material to form the thermoplastic resin member while the fitting portion is fit to the exposed surface of the thermosetting resin member.

The preparation process prepares the thermosetting resin member to which surface treatment is applied to provide a surface-processed portion so that at least a facing portion, to face the fitting portion, of the exposed surface belonging to a surface of the thermosetting resin member increases adhesiveness to the thermoplastic resin member compared to any other part of the surface except the facing portion. The resin molding process allows the surface-processed portion to remain adhered to the resin burr occurring in a gap between the fitting portion and the facing portion on the exposed surface of the thermosetting resin member.

The manufacturing method forms the base of the resin burr on the exposed surface of the thermosetting resin member as the surface-processed portion with improved adhesiveness to the thermoplastic resin member. The manufacturing method enables strong adhesiveness between the resin burr and the exposed surface. The manufacturing method can prevent loss of the resin burr while eliminating the need for an additional process to remove the resin burr.

BRIEF DESCRIPTION OF DRAWINGS

The above and other objects, features and advantages of the present disclosure will become more apparent from the following detailed description made with reference to the accompanying drawings.

DETAILED DESCRIPTION

Figure 1:
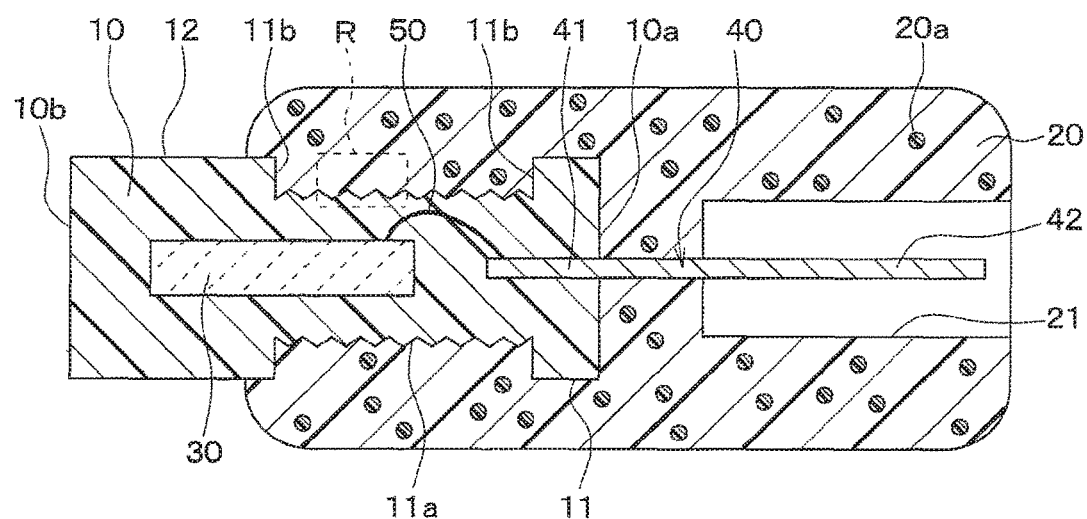
FIG. 1 is a schematic sectional view illustrating a semiconductor device as a resin molded article according to a first embodiment of a first working example of the disclosure.

Embodiments of working examples of the disclosure will be described with reference to the accompanying drawings. The mutually equal or corresponding parts in the embodiments are designated by the same reference numerals.

First Working Example

First Embodiment

Figure 2:
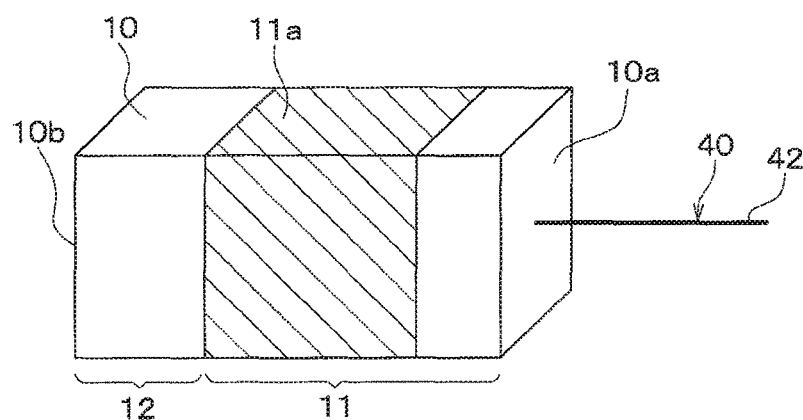
FIG. 2 is a perspective view schematically illustrating a thermosetting resin member in the semiconductor device in FIG. 1.

The description below explains a resin molded article according to a first embodiment of a first working example of the disclosure with reference to FIGS. 1 and 2. FIG. 1 greatly simplifies the uneven shape of a roughened surface 11a formed on the surface of a thermosetting resin member 10 and the height of a level difference 11b (to be described later) for ease of comprehension. FIG. 2 diagonally hatches the surface of the roughened surface 11a formed on the surface of the thermosetting resin member 10.

The resin molded article is used as a semiconductor device that is mounted on vehicles such as automobiles and drives various vehicular electronic devices. The semiconductor device as the resin molded article according to the embodiment includes a thermosetting resin member 10 and a thermoplastic resin member 20 that partially seals the surface of the thermosetting resin member 10.

The thermosetting resin member 10 is made of thermosetting resin such as epoxy resin. The thermosetting resin member 10 may contain a filler made of an insulating material such as silica or alumina as needed in the resin. The thermosetting resin member 10 is formed by performing molding such as transfer molding, compression molding, or the potting method and a thermoset process.

The thermoplastic resin member 20 is made of thermoplastic resin such as PPS (polyphenylene sulfide) or PBT (polybutylene terephthalate). The thermoplastic resin member 20 is formed by performing injection molding so as to partially seal the thermosetting resin member 10. The thermoplastic resin member 20 is doped with a functional group-containing additive 20a. The functional group-containing additive 20a is made of a polymer containing one or more of a hydroxyl group, an epoxide group, an amino group, and a carbonyl group. The functional group-containing additive 20a chemically reacts to a functional group on the roughened surface 11a of the thermosetting resin member 10 and enables highly adhesive bonding between thermosetting resin and thermoplastic resin.

The thermoplastic resin member 20 containing the functional group-containing additive 20a partially seals the surface of the thermosetting resin member 10. Part of the surface of the thermosetting resin member 10 provides a sealed surface 11 sealed with the thermoplastic resin member 20. The remaining part of the surface of the thermosetting resin member 10 except the sealed surface 11 provides an exposed surface 12 exposed from the thermoplastic resin member 20.

As in FIGS. 1 and 2, the thermosetting resin member 10 is configured as a cuboid block. The sealed surface 11 corresponds to part of the surface of the thermosetting resin member 10 at one end 10a of the thermosetting resin member 10 in a longer direction. The exposed surface 12 corresponds to the remaining part of the surface of the thermosetting resin member at the other end 10b in the longer direction.

More specifically, the thermosetting resin member 10 in FIGS. 1 and 2 forms a cuboid that includes one end face and the other end opposite this in the longer direction and four sides extending in the longer direction. The sealed surface 11 of the thermosetting resin member 10 corresponds to the one end 10a in the longer direction along which the one end face and the four sides are available. The exposed surface 12 of the thermosetting resin member 10 corresponds to the other end 10b in the longer direction along which the other end face and the four sides are available.

The thermosetting resin member 10 contains inside a semiconductor device 30 as a first sealed component and an electric connection member 40 as a second sealed component both sealed with the thermosetting resin member 10.

The semiconductor device 30 as the first sealed component is provided as a sensor chip that includes a silicon semiconductor and is used for a magnetic sensor, an optical sensor, or a pressure sensor. An ordinary semiconductor process fabricates the semiconductor device 30.

For example, the thermosetting resin member 10 entirely seals the semiconductor device 30 for magnetic sensors. The semiconductor device 30 detects external magnetism via the thermosetting resin member 10.

An unshown aperture is formed in the thermosetting resin member 10 to partially open the semiconductor device 30 for optical sensors or pressure sensors. The semiconductor device 30 detects light or pressure via the aperture.

The electric connection member 40 as the second sealed component electrically connects the semiconductor device 30 with an unshown wiring member outside the semiconductor device. The thermosetting resin member 10 coats a part 41 of the electric connection member 40. A remaining part 42 protrudes from the sealed surface 11 of the thermosetting resin member 10. The thermoplastic resin member 20 seals the remaining part 42 of the electric connection member 40 outside the thermosetting resin member 10. In addition, the tip of the remaining part 42 is exposed from the thermoplastic resin member 20.

The part 41 of the electric connection member 40 is electrically connected to the semiconductor device 30 inside the thermosetting resin member 10. A bonding wire 50 made of Al or Au is used for connection to the semiconductor device 30 though the connection technique is not limited thereto.

The thermoplastic resin member 20 seals the remaining part 42 of the electric connection member 40. The aperture 21 is formed in the thermoplastic resin member 20. The remaining part 42 of the electric connection member 40 is partially exposed outside the thermoplastic resin member 20 in the aperture 21.

The aperture 21 of the thermoplastic resin member 20 provides a region where an unshown external wiring member such as a connector member is inserted for connection. This allows the external wiring member and the electric connection member 40 to be connected electrically.

The semiconductor device 30 uses the electric connection member 40 that functions as detection or output. The semiconductor device 30 allows the electric connection member 40 to enable electrical interconnection with the outside of the device. According to the embodiment, the electric connection member 40 uses a terminal including a rod-like member made of Cu or Al. A circuit board may be used as the electric connection member 40.

Figure 3:
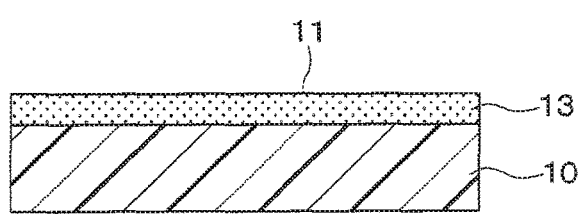
FIG. 3 is an enlarged view of area R included in the sectional view of a manufacturing process of the semiconductor device in FIG. 1.

In the semiconductor device according to the embodiment, the sealed surface 11 of the thermosetting resin member 10 is partially roughened and is provided as a roughened surface 11a. The roughened surface 11a is formed through a surface layer removal process of a manufacturing method (to be described later). The roughened surface 11a indicates a roughening degree (surface roughness Ra) greater than that of the sealed surface 11 and the exposed surface 12 other than the roughened surface 11a. Specifically, the roughened surface 11a indicates surface roughness Ra of several micrometers or more (e.g., 3 μm or more). Namely, the sealed surface 11 and the exposed surface 12 other than the roughened surface 11a correspond to a surface that includes a surface layer 13 to be described later (see FIG. 3). Surface roughness Ra corresponds to arithmetic mean roughness Ra defined in JIS (Japanese Industrial Standards).

As described, the remaining part 42 of the electric connection member 40, namely the second sealed component, protrudes from the sealed surface 11 of the thermosetting resin member 10 and is sealed with the thermoplastic resin member 20.

The sealed surface 11 is located between the exposed surface 12 of the thermosetting resin member 10 and the remaining part 42 of the electric connection member 40. The sealed surface 11 is provided with the roughened surface 11a so as to form a continuous closed-ring shape around the remaining part 42 of the electric connection member 40.

As in FIG. 2, the remaining part 42 of the electric connection member 40 protrudes from one end face of the cuboid thermosetting resin member 10. The roughened surface 11a is arranged to form a closed ring pattern that continues over four sides of the cuboid thermosetting resin member 10.

According to the embodiment, as in FIGS. 1 and 2, the roughened surface 11a is formed only inside the sealed surface 11 of the thermosetting resin member 10, namely, only inside the thermoplastic resin member 20. The end of the roughened surface 11a is positioned inside the thermoplastic resin member 20.

As described, the roughened surface 11a is formed by entirely removing the surface layer 13 (see FIG. 3) of the sealed surface 11. The roughened surface 11a is dented against the other part of the surface of the thermosetting resin member 10 and forms the level difference 11b between the roughened surface 11a and the other part of the surface thereof. The height of the level difference 11b is several micrometers or more (e.g., 5 μm or more).

The semiconductor device manufacturing method according to the embodiment will be described also with reference to FIGS. 3 through 6. A hardening mold process as in FIG. 3 uses a thermosetting resin material as a raw material for the thermosetting resin member 10. The hardening mold process heats and completely hardens the thermosetting resin material to form the thermosetting resin member 10.

Specifically, the hardening mold process performs transfer molding, compression molding, or potting to seal the semiconductor device 30 and the electric connection member 40 connected with each other through the bonding wire 50. The hardening mold process further heats and hardens the sealed whole of the semiconductor device 30 and the electric connection member 40. The thermosetting resin member 10 is thus fabricated.

The surface layer 13 containing a contaminated object exists as a topmost surface of the thermosetting resin member 10 formed by the hardening mold process. The contaminated object is contained in a constituent material of the thermosetting resin member 10. The contaminated object floats over the topmost surface during heat molding and rarely exists inward. The contaminated object includes a mold release agent or a foreign matter attached to the surface of the thermosetting resin member 10 during the process. The mold release agent is provided for the die surface or is mixed into the thermosetting resin material to ensure a demolding property during the molding. The mold release agent is made of siloxane or fatty acid.

Figure 4:
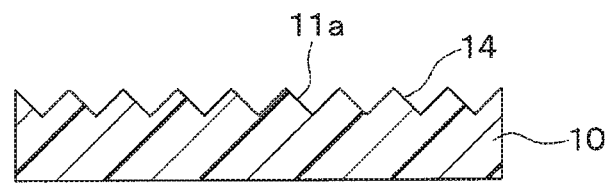
FIG. 4 is an enlarged view of area R in FIG. 1 as a sectional view of the manufacturing process following FIG. 3.
Figure 5:
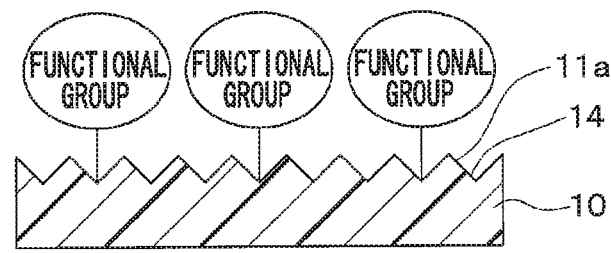
FIG. 5 is an enlarged view of area R in FIG. 1 as a sectional view of the manufacturing process following FIG. 4.

As in FIG. 4, the surface layer removal process is applied to the thermosetting resin member 10. The process removes the surface layer 13 on the topmost surface from part of the sealed surface 11 of the thermosetting resin member 10, namely, a region of the sealed surface 11 to form the roughened surface 11a and thereby forms the region as a newly formed surface 14.

Specifically, the process removes the surface layer 13 from a position targeted to form the roughened surface 11a of the sealed surface 11 using a technique such as laser irradiation, shot blast, or polishing. These techniques shave the processed surface to form irregularities. The laser irradiation is the most desirable technique. The sealed surface 11 just needs to be removed to form the roughened surface 11a approximately as deep as several micrometers or more (e.g., 5 μm or more) so as to be able to remove the surface layer 13.

These techniques remove the surface layer 13 as the contaminated object and roughen the newly formed surface 14 as a base for the surface layer 13. The newly formed surface 14 is thereby available as the roughened surface 11a that is given an anchor effect and excels in adhesion to the thermoplastic resin member 20. Actually, as in FIG. 5, the newly formed surface 14 as the roughened surface 11a includes one or more functional groups such as a hydroxyl group and an epoxide group in the thermosetting resin that configures the thermosetting resin member 10.

In particular, the laser irradiation is advantageously used for the surface layer removal process. This is because the newly formed surface 14 is burnt and the functional group at a burnt and oxidized portion further stimulates a chemical reaction to provide high adhesion. It is also advantageous to apply corona discharge treatment to the newly formed surface 14 of the thermosetting resin member 10 so that the newly formed surface 14 contains as many functional groups such as an OH group as possible.

Figure 6:
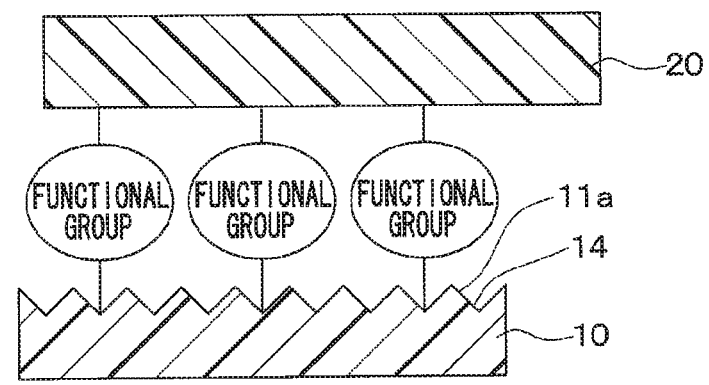
FIG. 6 is an enlarged view of area R in FIG. 1 as a sectional view of the manufacturing process following FIG. 5.

The surface layer removal process is followed by a plasticizing mold process in FIG. 6. This process injection-molds a thermoplastic resin material on the newly formed surface 14 containing the functional group of the thermosetting resin member 10. The thermoplastic resin material is doped with the functional group-containing additive 20a as a raw material for the thermoplastic resin member 20. For example, the thermoplastic resin material doped with the functional group-containing additive 20a can result from kneading a polymer containing the functional group as the functional group-containing additive 20a into the thermoplastic resin material as a base material. The thermoplastic resin member 20 thereby seals the sealed surface 11 of the thermosetting resin member 10 while chemically binding a functional group on the newly formed surface 14 to a functional group in the functional group-containing additive 20a contained in the thermoplastic resin material.

The plasticizing mold process causes chemical binding as follows. Suppose that the thermosetting resin member 10 is made of an epoxy resin. The hydroxyl group or the epoxide group in the epoxy resin is chemically bound to the hydroxyl group, the epoxide group, the amino group, or the carbonyl group in the functional group-containing additive 20a. Binding between hydroxyl groups or epoxide groups signifies covalent binding that provides stronger chemical binding. The covalent binding is available by using a constituent material of the functional group-containing additive 20a so that the constituent material contains at least one functional group equal to the one contained in the constituent material of the thermosetting resin member 10.

The chemical binding enables high adhesion between the newly formed surface 14 (i.e., roughened surface 11a) of the thermosetting resin member 10 and thermoplastic resin member 20. The semiconductor device as the resin molded article according to the embodiment is thus fabricated.

Processes subsequent to the surface layer formation process selectively process parts of the surface of the thermosetting resin member 10. The processes require appropriate masking on surfaces that are not processed.

The manufacturing method forms the newly formed surface 14 by removing the contaminated object from the sealed surface 11 at a surface boundary between the sealed surface 11 of the thermosetting resin member 10 and the thermoplastic resin member 20 sealing the sealed surface 11. The newly formed surface 14 provides chemical binding between the thermosetting resin member 10 and the thermoplastic resin member 20 via the functional group.

The chemical binding enables high adhesion between the thermosetting resin member 10 and the thermoplastic resin member 20. The embodiment can improve the adhesion between the thermosetting resin member 10 and the thermoplastic resin member 20.

The sealing configuration for the thermoplastic resin member 20 according to the embodiment may allow a penetrant substance such as external moisture or a contaminated object to penetrate into the device along the surface boundary between the thermosetting resin member 10 and the thermoplastic resin member 20 from the end of the boundary between the sealed surface 11 and the exposed surface 12. In particular, a contaminated object such as moisture or oil existent in the usage environment may penetrate into the onboard semiconductor device according to the embodiment.

According to the embodiment, the remaining part 42 of the electric connection member 40 as a sealed component protrudes from the sealed surface 11 of the thermosetting resin member 10 and is sealed with the thermoplastic resin member 20. In this case, the penetrant substance may stick to the remaining part of the electric connection member 40 and adversely affect characteristics.

To solve this issue, the embodiment provides the roughened surface 11a to form a closed-ring shape for the sealed surface 11 of the thermosetting resin member 10, more specifically, for the region located between the exposed surface 12 and the remaining part 42 of the electric connection member 40 protruding from the sealed surface 11.

The closed-ring shape provides the region that ensures high adhesion and prevents the separation as described. The embodiment can possibly prevent the penetrant substance from reaching the remaining part 42 of the electric connection member 40 from the exposed surface 12 through the surface boundary between both resin members 10 and 20.

Figure 7:
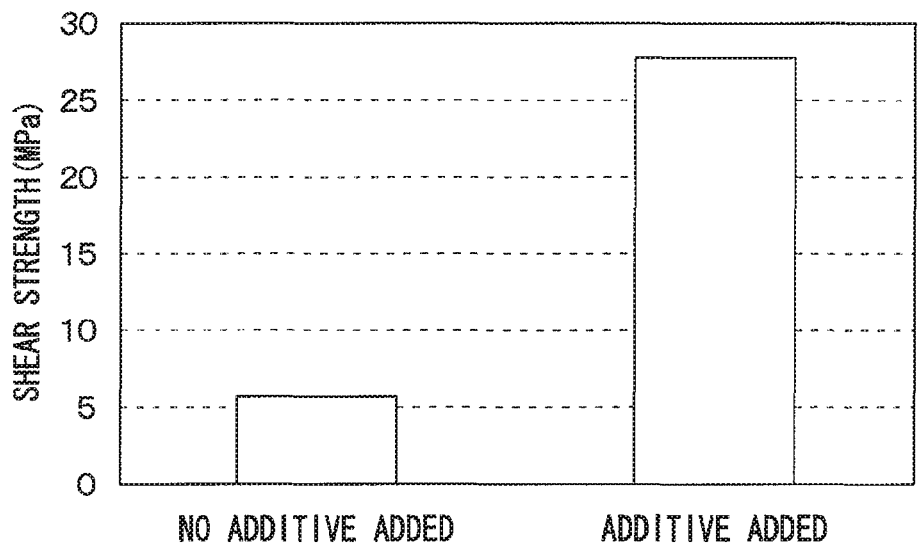
FIG. 7 is a diagram illustrating an effect of the semiconductor device manufacturing method according to the first embodiment of the first working example.
Figure 8:
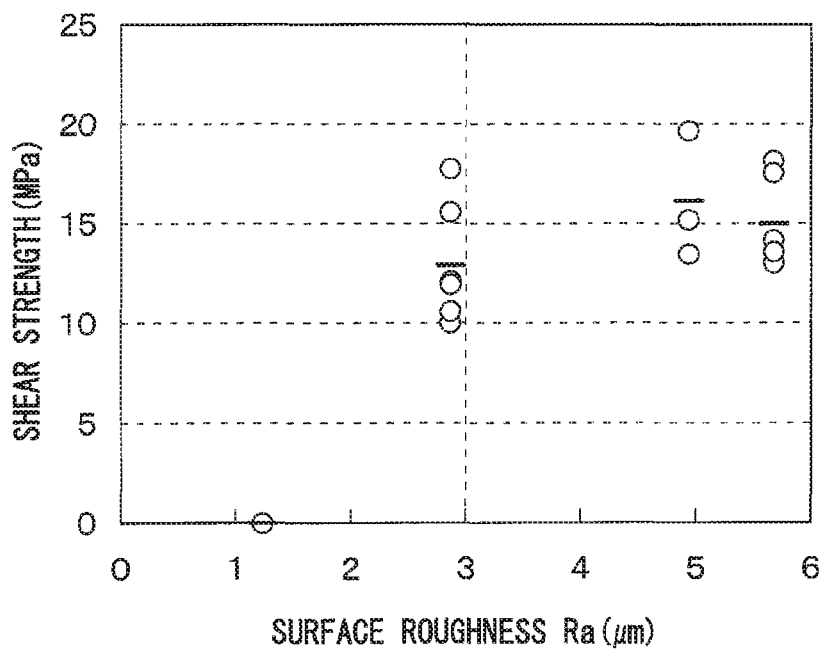
FIG. 8 is a diagram illustrating an effect of the semiconductor device manufacturing method according to the first embodiment of the first working example.
Figure 9:
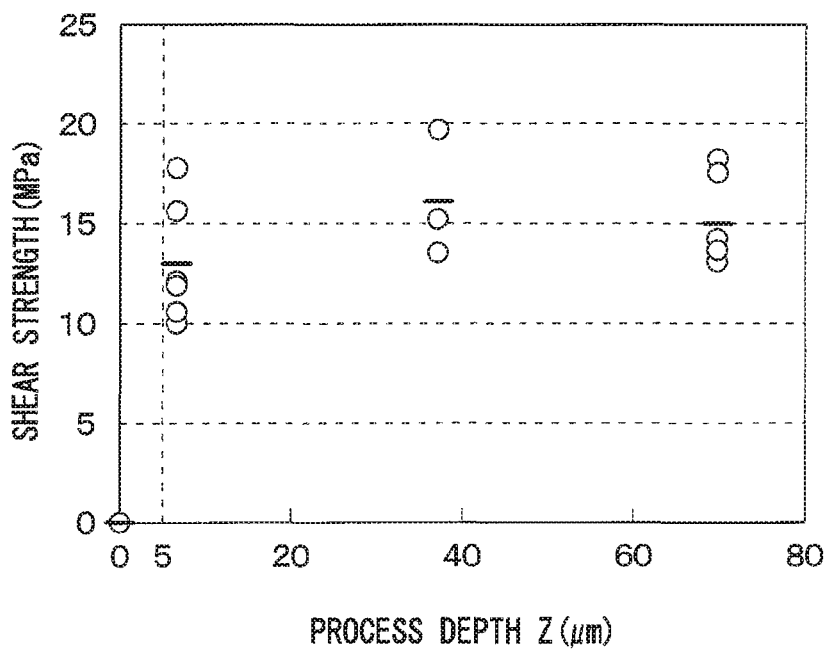
FIG. 9 is a diagram illustrating an effect of the semiconductor device manufacturing method according to the first embodiment of the first working example.

The description below more specifically explains effects of removing the surface layer 13 and improving the adhesion between both resin members 10 and 20 due to chemical binding with reference to FIGS. 7 through 9. FIGS. 7 through 9 illustrate only examples of the effect of improving the adhesion. The effect is not limited thereto.

In the examples of FIGS. 7 through 9, one rectangular plate-like test piece corresponds to the thermosetting resin member 10 and is made of thermosetting resin. The other rectangular plate-like test piece corresponds to the thermoplastic resin member 20 and is made of thermoplastic resin. A resin molded article was fabricated based on the manufacturing method so that both test pieces are bonded. The shear strength (unit: MPa) was measured at a part of bonding both test pieces.

In the experiment according to the example of FIG. 7, an ordinary epoxy resin for semiconductor device sealing was transfer-molded and then laser irradiation was applied to the surface to form the newly formed surface 14 including the roughened surface 11a. PPS was injection-molded as a thermoplastic resin material to form the thermoplastic resin member 20 and the shear strength was evaluated depending on whether to add an epoxy resin comparable to the functional group-containing additive 20a as a thermoplastic resin material. FIG. 7 illustrates an evaluation result.

As in the drawing, great improvement of the shear strength, namely, significant improvement of the adhesion between both resin members 10 and 20 was confirmed in the case of adding the functional group-containing additive 20a according to the embodiment in comparison with the case of not adding the functional group-containing additive 20a. Specifically, the shear strength is approximately 5 MPa when the functional group-containing additive 20a is not added. The shear strength increases to 27 MPa when the functional group-containing additive 20a is added. According to our conclusion, no chemical binding occurs due to functional groups and the adhesion does not improve when the functional group-containing additive 20a is not added. Chemical binding occurs due to functional groups and the adhesion improves when the functional group-containing additive 20a is added.

FIGS. 8 and 9 illustrate investigations into of relation between the shear strength and the surface roughness Ra (unit: μm) of the roughened surface 11a and relation between the shear strength and process depth Z (unit: μm), respectively, when the surface layer removal process uses a laser irradiation technique. In the drawings, a circle represents each experiment result. A bar represents an average value of experiment results when surface roughness Ra or process depth Z is identical. Process depth Z corresponds to the height of the level difference 11b. The laser irradiation applies a laser beam to the surface to scan the surface and remove the surface layer 13.

As in FIGS. 8 and 9, the laser irradiation is supposed to provide sufficient adhesion strength when the surface layer removal process is performed on condition of Ra≥3 μm and Z≥5 μm.

Similar experiments were conducted using shot blast and polishing as well as the laser irradiation. The shot blast sprays Alundum (alumina powder #80) onto the surface to remove the surface layer 13. The polishing is performed as hand polishing (manual hand polishing) using polishing paper (#80) to remove the surface layer 13. It was confirmed that these techniques also provide sufficient adhesion strength when the surface removal process includes a process similarly to the laser irradiation.

According to the experiment result, the adhesion decreases in the order of the laser irradiation, the shot blast, and the polishing. This is probably because the laser irradiation burns the newly formed surface 14 and the functional group at a burnt and oxidized portion further stimulates a chemical reaction to provide high adhesion. Any technique is applicable if it can remove the surface layer 13. However, the laser irradiation is advantageous if high adhesion strength is needed. Obviously, the shot blast or the polishing is also applicable if it can provide surface roughness Ra and process depth Z comparable to the laser irradiation.

Second Embodiment

Figure 10:
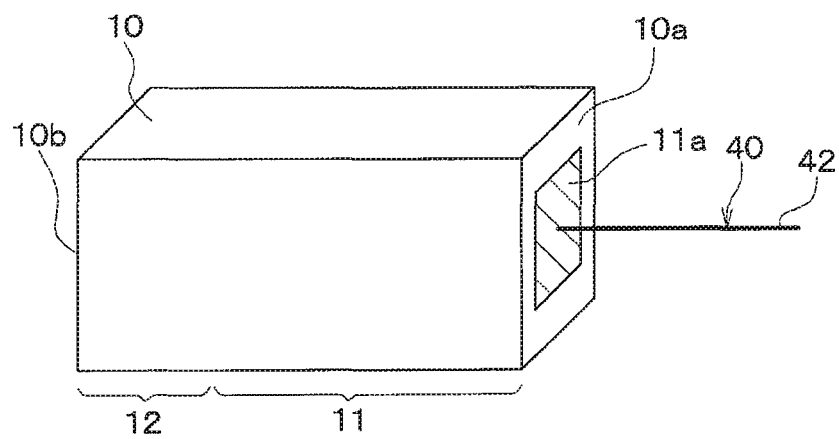
FIG. 10 is a perspective view schematically illustrating a thermosetting resin member contained in the semiconductor device as a resin molded article according to a second embodiment of the first working example of the disclosure.

With reference to FIG. 10, the description below explains a major part of the semiconductor device as the resin molded article according to the second embodiment of the first working example of the disclosure. The second embodiment differs from the first embodiment of the first working example in a changed arrangement pattern of the roughened surface 11a of the thermosetting resin member 10. The description below centers on the difference.

According to the first embodiment of the first working example, as in FIG. 2, the roughened surface 11a is provided based on the arrangement pattern as a closed ring pattern that continues over four sides of the cuboid thermosetting resin member 10.

According to the second embodiment, as in FIG. 10, the roughened surface 11a is arranged only on one end face, namely, the end face of the cuboid thermosetting resin member 10 at one end 10a.

Also in this case, the arrangement pattern of the roughened surface 11a is provided as a closed-ring shape that surrounds the remaining part 42 of the electric connection member 40 protruding from the one end face as the sealed surface 11. The second embodiment also provides the effect of the closed ring pattern similarly to the first embodiment of the first working example.

Other Embodiments

According to the embodiments of the first working example, as in FIGS. 1, 2, and 10, the roughened surface 11a is provided for part of the sealed surface 11 of the thermosetting resin member 10. The roughened surface 11a may be provided for the whole of the sealed surface 11. Namely, the roughened surface 11a may be provided for at least part of the sealed surface 11.

The roughened surface 11a may be formed up to the exposed surface 12 in addition to the sealed surface 11. Further, the roughened surface 11a may be formed over the entire surface of the thermosetting resin member 10.

As described, the roughened surface 11a is provided for part of the sealed surface 11 favorably in a continuous closed ring pattern as the arrangement pattern. Moreover, the roughened surface 11a may be provided for the sealed surface 11 so as to be island shaped.

In FIG. 1, the roughened surface 11a is provided within the range of the sealed surface 11. Therefore, the level difference 11b is sealed inside the thermoplastic resin member 20. However, the roughened surface 11a may be continuously formed up to part of the exposed surface 12 beyond the sealed surface 11 of the thermosetting resin member 10. In this case, the level difference 11b is exposed from the thermoplastic resin member and is visible.

The first sealed component and the second sealed component just need to be sealed with the thermosetting resin member 10 and are not limited to the semiconductor device 30, the electric connection member 40, or the circuit board as described.

The shape of the thermosetting resin member 10 is not limited to cuboid as described. The thermosetting resin member 10 may be formed into a spherical shape or an indefinite shape. The thermoplastic resin member 20 just needs to satisfy the sealing configuration so that the surface of the thermosetting resin member 10 is partly sealed and the remaining part is exposed. The sealing configuration is not limited to the illustrated example in which one end 10a of the thermosetting resin member 10 provides the sealed surface 11 and the other end thereof provides the exposed surface.

According to the embodiments, the resin molded article is provided as a semiconductor device. The inside of the thermosetting resin member 10 is provided with the semiconductor device 30 as a sealed component sealed with the thermosetting resin member 10. However, the resin molded article is not limited to the semiconductor device. The thermosetting resin member 10 may be configured to be void of the sealed component.

Second Working Example

First Embodiment

Figure 11:
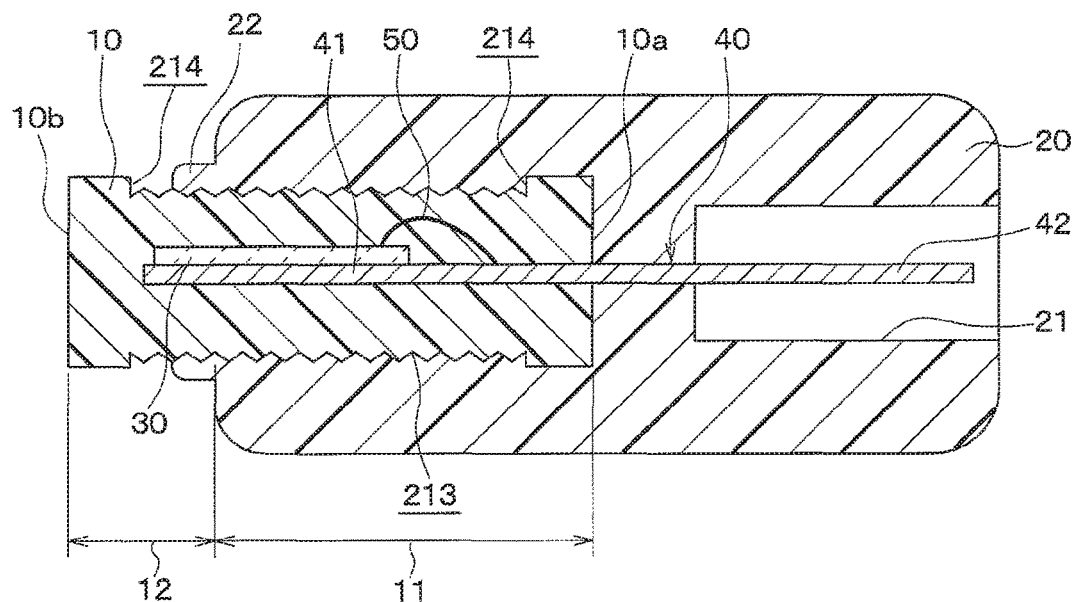
FIG. 11 is a perspective view schematically illustrating a thermosetting resin member contained in the semiconductor device as a resin molded article according to a first embodiment of a second working example of the disclosure.
Figure 12:
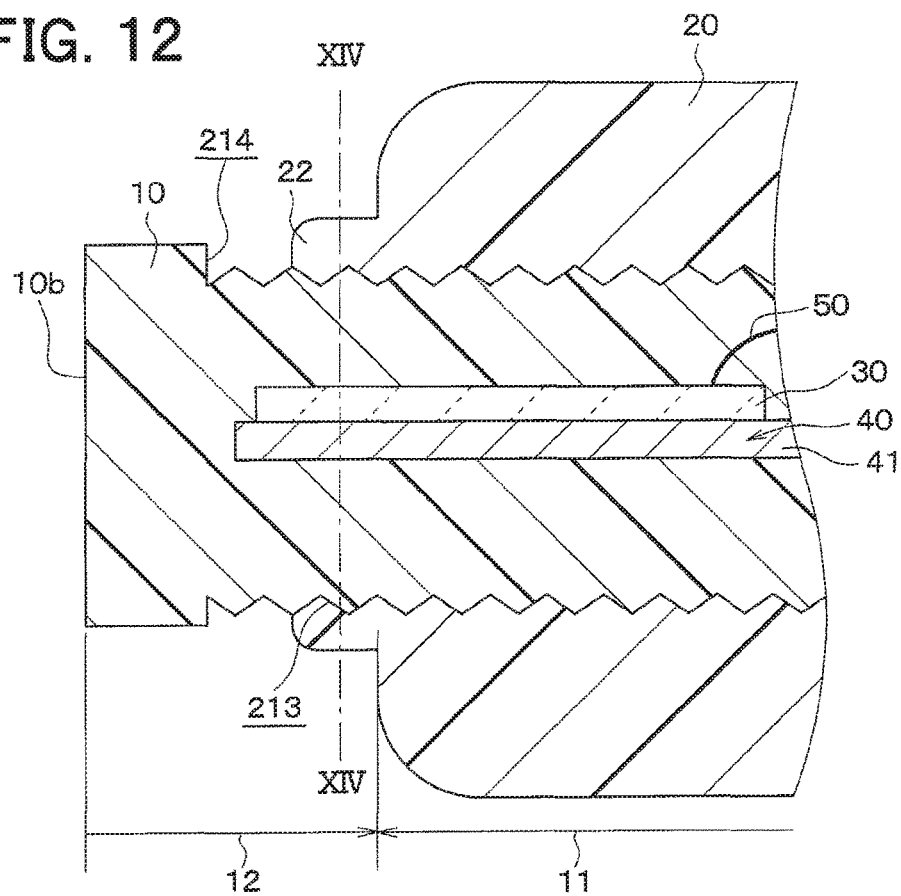
FIG. 12 is an enlarged view near a resin burr in the semiconductor device in FIG. 11.
Figure 13:
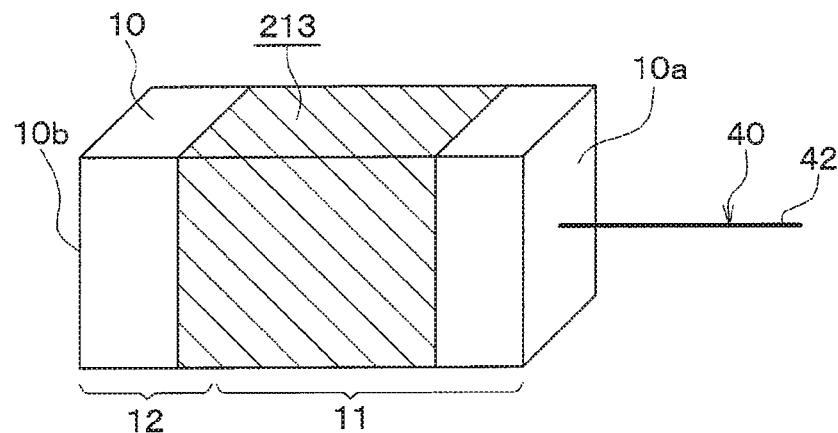
FIG. 13 is a perspective view schematically illustrating a thermosetting resin member in the semiconductor device in FIG. 11.

With reference to FIGS. 11 through 13, the description below explains the resin molded article according to the first embodiment of a second working example of the disclosure. FIGS. 11, 12, and subsequent sectional views greatly simplify the uneven shape of a surface-processed portion 213 as a roughened surface formed on the surface of the thermosetting resin member 10, the thickness of a resin burr 22, and the height of a level difference 214 (to be described later) for ease of comprehension. FIG. 13 and subsequent perspective views diagonally hatch the surface of the surface-processed portion 213 formed on the surface of the thermosetting resin member 10 for the sake of identification and convenience.

The resin molded article is used as a semiconductor device that is mounted on vehicles such as automobiles and drives various vehicular electronic devices. The semiconductor device as the resin molded article according to the embodiment includes the thermosetting resin member 10 and the thermoplastic resin member 20 that partially seals the surface of the thermosetting resin member 10.

The thermosetting resin member 10 is made of a thermosetting resin material such as epoxy resin. The thermosetting resin member 10 may contain a filler made of an insulating material such as silica or alumina as needed in the resin. The thermosetting resin member 10 is formed by performing molding such as transfer molding, compression molding, or the potting method and a thermoset process.

The thermoplastic resin member 20 is made of thermoplastic resin such as PPS (polyphenylene sulfide) or PBT (polybutylene terephthalate). The thermoplastic resin member 20 is formed by performing injection molding so as to partially seal the thermosetting resin member 10.

The thermoplastic resin member 20 partially seals the surface of the thermosetting resin member 10. Part of the surface of the thermosetting resin member 10 provides the sealed surface 11 sealed with the thermoplastic resin member 20. The remaining part of the surface of the thermosetting resin member 10 except the sealed surface 11 provides the exposed surface 12 that is continuous with the sealed surface 11 and is exposed from the thermoplastic resin member 20.

As in FIGS. 11 through 13, the thermosetting resin member 10 is configured as a cuboid block. The sealed surface 11 corresponds to part of the surface of the thermosetting resin member 10 at one end 10a of the thermosetting resin member 10 in a longer direction. The exposed surface 12 corresponds to the remaining part of the surface of the thermosetting resin member at the other end 10b in the longer direction.

More specifically, the thermosetting resin member 10 in FIGS. 11 through 13 forms a cuboid that includes one end face and the other end opposite this in the longer direction and four sides extending in the longer direction.

The sealed surface 11 of the thermosetting resin member 10 corresponds to one end face in the longer direction and a region of the four sides toward one end 10a in the longer direction. The exposed surface 12 of the thermosetting resin member 10 corresponds to the other end face in the longer direction and a region of the four sides toward the other end 10b in the longer direction.

The semiconductor device as a resin molded article is formed by inserting the thermosetting resin member 10 into the thermoplastic resin member 20 so that the thermoplastic resin member 20 seals the sealed surface 11 and exposes the exposed surface 12 out of the surface of the thermosetting resin member 10. As in FIG. 11, the end of the surface boundary between both resin members 10 and 20 is exposed outside.

The thermosetting resin member 10 contains inside the semiconductor device 30 and the electric connection member 40 as sealed components sealed with the thermosetting resin member 10. The semiconductor device 30 is provided as a sensor chip that includes a silicon semiconductor and is used for a magnetic sensor, an optical sensor, or a pressure sensor. An ordinary semiconductor process fabricates the semiconductor device 30.

For example, the thermosetting resin member 10 entirely seals the semiconductor device 30 for magnetic sensors. The semiconductor device 30 detects external magnetism via the thermosetting resin member 10.

An unshown aperture is formed in the thermosetting resin member 10 to partially open the semiconductor device 30 for optical sensors or pressure sensors. The semiconductor device 30 detects light or pressure via the aperture.

The electric connection member 40 electrically connects the semiconductor device 30 with an unshown wiring member outside the semiconductor device. The electric connection member 40 may include a lead frame or a wiring board. In the example, the electric connection member 40 includes a typical lead frame made of Cu (copper) or 42Alloy.

The electric connection member 40 as a lead frame is formed by integrating a mount portion 41 with a terminal portion 42 using a die bonding material such as solder. The mount portion 41 mounts the semiconductor device 30. The terminal portion 42 enables electric connection between the semiconductor device and the outside.

The mount portion 41 of the electric connection member 40 is coated with the thermosetting resin member 10. The terminal portion 42 protrudes from the sealed surface 11 of the thermosetting resin member 10. The thermoplastic resin member 20 seals the terminal portion 42 of the electric connection member 40 outside the thermosetting resin member 10. The tip of the terminal portion 42 is exposed from the thermoplastic resin member 20.

The mount portion 41 of the electric connection member 40 is electrically connected to the semiconductor device 30 inside the thermosetting resin member 10. The bonding wire 50 made of Al or Au is used for connection to the semiconductor device 30 though the connection technique is not limited thereto.

The thermoplastic resin member 20 seals the terminal portion 42 of the electric connection member 40. The aperture 21 is formed in the thermoplastic resin member 20. The terminal portion 42 of the electric connection member 40 is partially exposed outside the thermoplastic resin member 20 in the aperture 21.

The aperture 21 of the thermoplastic resin member 20 provides a region where an unshown external wiring member such as a connector member is inserted for connection. This aperture 21 allows the external wiring member and the terminal portion 42 of the electric connection member 40 to be connected electrically.

The semiconductor device 30 uses the electric connection member 40 that functions as detection or output. The semiconductor device 30 allows the electric connection member 40 to enable electrical interconnection with the outside of the device.

According to the embodiment, as in FIGS. 11 and 12, the thermoplastic resin member 20 is partially pushed out onto the exposed surface 12 along the exposed surface 12 to form the resin burr 22 at the boundary between the sealed surface 11 and exposed surface 12 of the thermosetting resin member 10.

The resin burr 22 is formed at the surface boundary between the thermosetting resin member 10 and the thermoplastic resin member 20, more specifically, at the end of the surface boundary located at the boundary between the sealed surface 11 and the exposed surface 12. The resin burr 22 is formed during injection molding of the thermoplastic resin member 20. The resin burr 22 is pushed out of the regular shape of the thermoplastic resin member 20 and is formed into a thin fin.

To be exact, the exposed surface 12 is not entirely exposed at the thermosetting resin member 10. The resin burr 22 coats an area of the exposed surface 12 toward the sealed surface 11, namely, an area of the exposed surface 12 that is continuously adjacent to the sealed surface 11 to cover a predetermined width.

The resin burr 22 is formed to range from the boundary between the sealed surface 11 and the exposed surface 12 to part of the exposed surface 12. The resin burr 22 is formed over the area to cover the predetermined width from the boundary toward the exposed surface 12. The exposed surface 12 is exposed except the resin burr 22.

The resin burr 22 may be formed over the whole of the boundary between the sealed surface 11 and the exposed surface 12 of the thermosetting resin member 10 or only part of the boundary. Typically, the resin burr 22 is formed over the whole of the boundary as in FIG. 14.

Specifically, FIGS. 11 through 13 illustrate examples of the boundary between the sealed surface 11 and the exposed surface 12 of the thermosetting resin member 10 shaped into a cuboid block. The boundary exists so as to extend across four sides of the whole circumference around the axis along the longer direction. In this case, as in FIG. 14, the resin burr 22 also exists across the whole circumference of the thermosetting resin member 10 around the axis along the longer direction.

Figure 15:
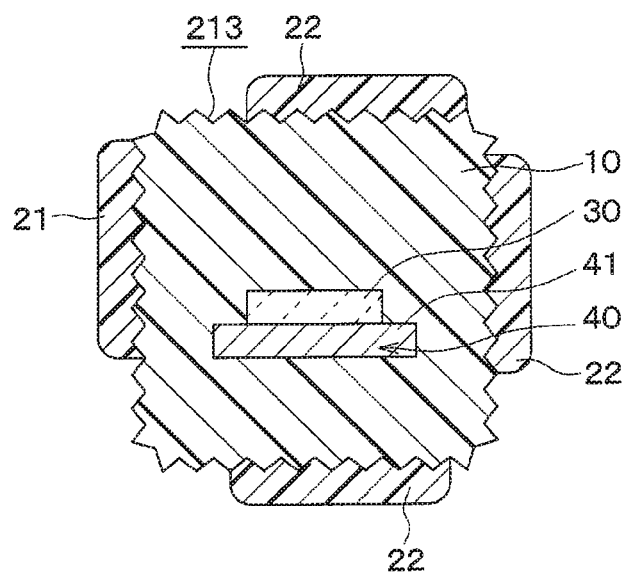
FIG. 15 is a schematic sectional view illustrating another example of the sectional configuration in FIG. 14.
Figure 16:
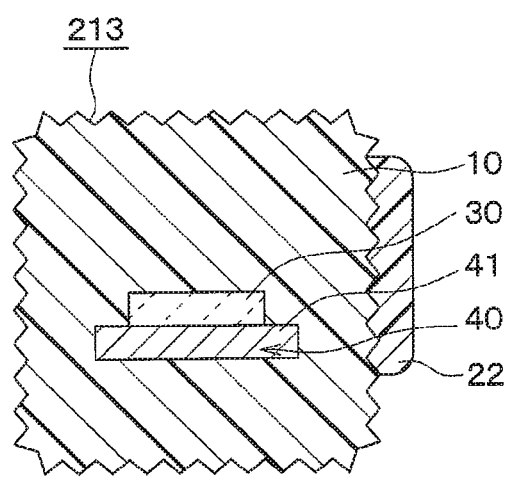
FIG. 16 is a schematic sectional view illustrating still another example of the sectional configuration in FIG. 14.

FIGS. 15 and 16 illustrate examples of the resin burr 22 formed at part of the boundary between the sealed surface 11 and the exposed surface 12 of the thermosetting resin member 10. According to the example in FIG. 15, the resin burr 22 exists intermittently on the boundary. According to the example in FIG. 16, the resin burr 22 exists at one location on the boundary. The resin burr 22 just needs to be formed at least at part of the boundary.

In the semiconductor device according to the embodiment, the surface of the thermosetting resin member 10 is partially formed into the surface-processed portion 213 where surface treatment is performed to improve adhesiveness to the thermoplastic resin member 20. The surface treatment is applied to the surface-processed portion 213 so that the adhesiveness to the thermoplastic resin member 20 is larger than parts other than the surface-processed portion 213 on the surface of the thermosetting resin member 10.

In the examples, the surface-processed portion 213 is applicable to both parts on the surface of the thermosetting resin member 10, namely, a base portion of the resin burr 22 on the exposed surface 12 and the sealed surface 11 continuous with the base portion of the resin burr 22. The surface treatment is applied to both parts so that adhesiveness to the thermoplastic resin member 20 is larger than the other parts than both parts on the surface of the thermosetting resin member 10.

The base portion of the resin burr 22 on the exposed surface 12 is located immediately below the resin burr 22, namely, an area corresponding to a projection of the resin burr 22 on the exposed surface 12. Namely, the surface-processed portion 213 according to the embodiment is provided to be continuous with the area of the sealed surface 11 and the area of the exposed surface 12 toward the sealed surface 11.

According to the embodiment, as in FIG. 13, the surface-processed portion 213 is also provided for the area of the exposed surface 12 toward the sealed surface 11 similarly to the sealed surface 11 across the whole circumference of the thermosetting resin member 10. Namely, the whole area of the exposed surface 12 toward the sealed surface 11 is formed as the surface-processed portion 213.

As described, the resin burr 22 is not necessarily formed all around the boundary between the exposed surface 12 and the sealed surface 11. However, the area of the exposed surface 12 toward the sealed surface 11 is continuous with the boundary and is likely to generate the resin burr 22. For this reason, the whole area of the exposed surface 12 toward the sealed surface 11 needs to be formed as the surface-processed portion 213.

Figure 14:
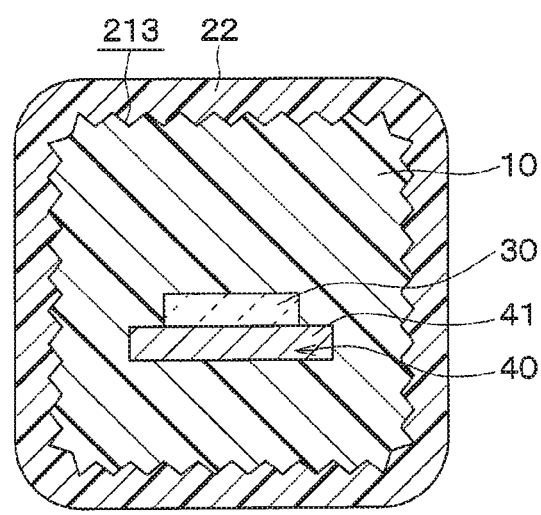
FIG. 14 is a schematic sectional view illustrating a cross section along the dot-and-dash line XIV-XIV in FIG. 12.

In FIGS. 13 and 14 illustrate that the resin burr 22 is formed all around the boundary between the sealed surface 11 and the exposed surface 12. The whole area of the exposed surface 12 toward the sealed surface 11 actually corresponds to the base portion of the resin burr and the surface-processed portion 213.

FIGS. 15 and 16 illustrate that the resin burr 22 is formed at only part of the boundary. The whole area of the exposed surface 12 toward the sealed surface 11 corresponds to the surface-processed portion 213. In this case, part of the surface-processed portion 213 corresponds to the base portion of the resin burr 22. The remaining part of the surface-processed portion 213 is void of the resin burr 22.

The surface-processed portion 213 may be formed on only part of the area of the exposed surface 12 toward the sealed surface 11 if the resin burr 22 is obviously expected to occur at only a specified region of the boundary between the sealed surface 11 and the exposed surface 12. In any case, the base portion of the resin burr 22 surely equals the surface-processed portion 213.

The surface-processed portion 213 according to the embodiment corresponds to a surface where a roughening process is applied. Namely, the surface-processed portion 213 provides a roughened surface that is rougher than parts other than the surface-processed portion 213 on the surface of the thermosetting resin member 10. The surface-processed portion 213 is therefore given an anchor effect and improves adhesiveness to the thermoplastic resin member 20.

The surface-processed portion 213 as a roughened surface is formed by a surface layer removal of the manufacturing method to be described later. The roughening degree (surface roughness Ra) of the roughened surface is configured to be greater than that of the other part of the surface of the thermosetting resin member 10 except the roughened surface.

Specifically, the surface-processed portion 213 as the roughened surface indicates surface roughness Ra of several micrometers or more (e.g., 3 μm or more). Surface roughness Ra corresponds to arithmetic mean roughness Ra defined in JIS (Japanese Industrial Standards), standard number B0601.

According to the embodiment, as in FIGS. 11 and 12, the surface-processed portion 213 is formed to exceed the base portion of the resin burr 22 on the exposed surface 12 of the thermosetting resin member 10. Namely, the surface-processed portion 213 is pushed out of the end of the resin burr 22 on the exposed surface 12.

As described, the surface-processed portion 213 corresponds to the surface formed by entirely removing the surface layer from the thermosetting resin member 10. The surface-processed portion 213 is lowered from the surface of the thermosetting resin member 10. The level difference 214 is formed between the surface-processed portion 213 and the surface of the thermosetting resin member 10 except the surface-processed portion 213. The height of the level difference 214 is several micrometers or more (e.g., 5 μm or more) so as to be capable of visual confirmation.

The semiconductor device manufacturing method according to the embodiment will be described also with reference to FIG. 17. The manufacturing method includes a preparation process and a resin molding process. The preparation process prepares the thermosetting resin member 10 illustrated in FIGS. 11 through 14. The resin molding process performs injection molding to form the thermoplastic resin member 20 using a die 2100 as in FIG. 17 and partially seals the thermosetting resin member 10.

The preparation process heats and completely hardens the thermosetting resin material as raw materials for the thermosetting resin member 10 to mold the thermosetting resin member 10. Specifically, the molding performs transfer molding, compression molding, or potting to seal the semiconductor device 30 and the electric connection member 40 connected with each other through the bonding wire 50. The molding further heats and hardens the sealed whole of the semiconductor device 30 and the electric connection member 40.

The preparation process further forms the surface-processed portion 213 as in FIGS. 11 through 14 on the surface of the thermally hardened thermosetting resin member 10. The formation of the surface-processed portion 213 will be described more specifically later. The preparation process is thus completed.

The resin molding process is then performed. As in FIG. 17, the process uses the die 2100 to mold the thermoplastic resin member 20. The die 2100 includes a molding portion 2110 and a fitting portion 2120. The molding portion 2110 includes a cavity 2111 having a hollow shape corresponding to the external shape of the thermoplastic resin member 20. The fitting portion 2120 is provided adjacently to the molding portion 2110.

The fitting portion 2120 is provided integrally and continuously with the molding portion 2110. The fitting portion 2120 fits into the exposed surface 12 of the thermosetting resin member 10. Namely, the fitting portion 2120 provides the die 2100 with a matching surface for the exposed surface 12 of the thermosetting resin member 10.

Figure 17:
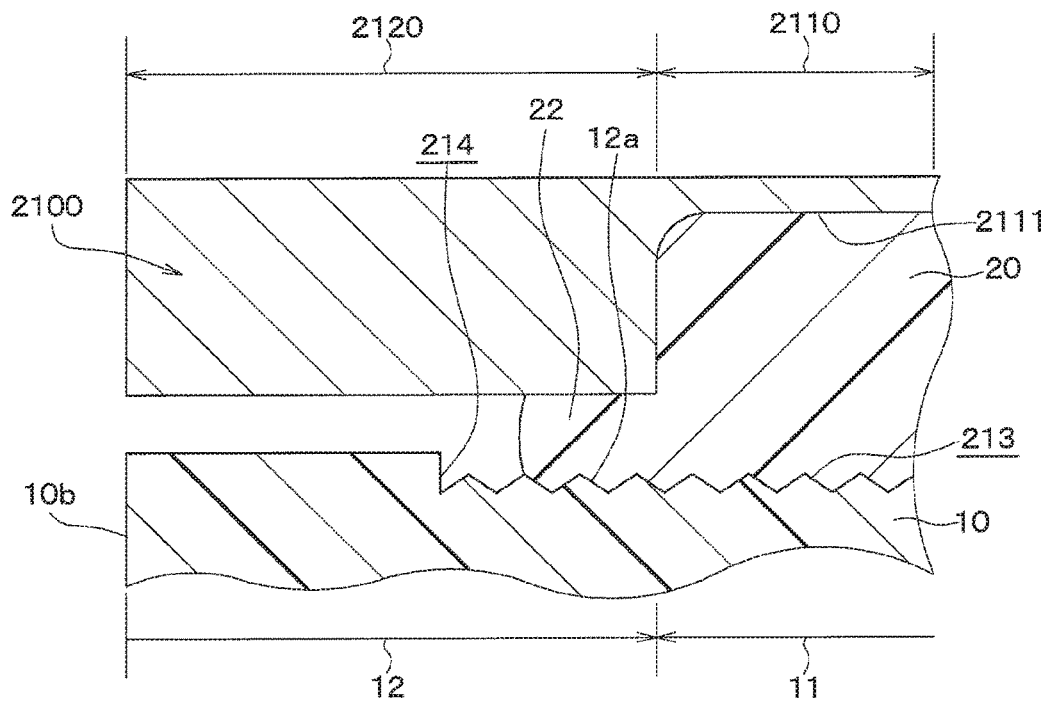
FIG. 17 is a schematic sectional view illustrating a resin molding process in the resin molded article manufacturing method according to the first embodiment of the second working example.

As in FIG. 17, the resin molding process places the sealed surface 11 of the thermosetting resin member 10 in the cavity 2111 so that the exposed surface 12 of the thermosetting resin member 10 fits into the fitting portion 2120. In this state, a thermoplastic resin material is injected into the cavity 2111 to be filled. The thermoplastic resin member 20 is thus molded to partially seal the thermosetting resin member 10.

The description below explains how the preparation process forms the surface-processed portion 213. As described, the surface-processed portion 213 according to the embodiment provides the roughened surface formed over the sealed surface 11 and the base portion of the resin burr 22 on the exposed surface 12 on the surface of the thermosetting resin member 10.

In FIG. 17, the base portion of the resin burr 22 on the exposed surface 12 corresponds to a facing portion 12a on the exposed surface 12 that faces the fitting portion 2120. The facing portion 12a belongs to the exposed surface 12 and faces the fitting portion 2120 continuously and adjacently to the sealed surface 11. The facing portion 12a corresponds to part of the exposed surface 12 that is likely to generate the resin burr 22.

In FIG. 13, the fitting portion 2120 faces the whole of the exposed surface 12 ranging from the boundary between the sealed surface 11 and the exposed surface 12 to the other end 10b of the thermosetting resin member 10 in the longer direction. The facing portion 12a is defined as the exposed surface 12 the fitting portion 2120 faces.

The preparation process applies surface treatment to both parts of the surface of the thermosetting resin member 10, namely, the sealed surface 11 and the facing portion 12a of the exposed surface 12 so that both parts of the surface increase adhesiveness to the thermoplastic resin member 20 compared to the other parts than both parts.

An unshown surface layer containing a contaminated object exists as a topmost surface of the thermosetting resin member 10 thermally hardened by the preparation process. The contaminated object includes a mold release agent or a foreign matter attached to the surface of the thermosetting resin member 10 during the process. The mold release agent is provided for the surface of the die 2100 or is mixed into the thermosetting resin material to ensure a demolding property during the molding. The mold release agent is made of siloxane or fatty acid.

The surface treatment according to the embodiment removes the surface layer to form the surface-processed portion 213 as a roughened surface. That is, the surface treatment performs a process that removes the surface layer located at the topmost surface from both parts of the surface of the thermosetting resin member 10, namely, the sealed surface 11 and the facing portion 12a of the exposed surface 12 and forms both parts into a newly formed surface.

Specifically, the process removes the surface layer from a position targeted to form the surface-processed portion 213 using a technique such as laser irradiation, shot blast, or polishing. These techniques represent the roughening process that shaves the surface to form irregularities. The laser irradiation is the most desirable technique.

The laser irradiation forms the surface-processed portion 213 as a roughened surface that is rougher than parts other than the surface-processed portion 213 on the surface of the thermosetting resin member 10. The process just needs to ensure the removal depth approximately several micrometers or more (e.g., 5 µm or more) so as to be able to remove the surface layer.

These techniques remove the surface layer as the contaminated object and roughen the newly formed surface as a base for the surface layer. The newly formed surface is thereby available as the roughened surface that is given an anchor effect and excels in adhesion to the thermoplastic resin member. The newly formed surface forms the surface-processed portion 213.

In particular, the laser irradiation is advantageously used for the surface treatment. This is because the newly formed surface is burnt and the functional group at a burnt and oxidized portion further stimulates a chemical reaction to provide high adhesion to the thermoplastic resin member 20.

The preparation process forms the surface-processed portion 213 and then the resin molding process is performed to keep the resin burr 22 adhered to the highly adhesive surface-processed portion 213. Suppose that the resin burr 22 is generated at a gap between the fitting portion 2120 and the facing portion 12a of the exposed surface 12 of the thermosetting resin member 10.

The resin molding process generates a gap between the fitting portion 2120 and the facing portion 12a of the exposed surface 12 of the thermosetting resin member 10 due to an opening or deformation of the die 2100 resulting from a design-time dimension tolerance or a resin pressure. The cavity 2111 is filled with the thermoplastic resin material. The thermoplastic resin material is then pushed out of the cavity 2111 due to the resin pressure and enters the gap as in FIG. 17. This thermoplastic resin material corresponds to the resin burr 22.

According to the embodiment, the facing portion 12a of the thermosetting resin member 10 is previously formed into the surface-processed portion 213 in the gap. Therefore, the resin burr 22 remains adhered to the surface-processed portion 213.

When the resin molding process is complete, the resin molded article according to the embodiment is formed while the thermoplastic resin member 20 partially seals the thermosetting resin member 10 and generates the resin burr 22.

Processes subsequent to the surface layer formation process selectively process parts of the surface of the thermosetting resin member 10. The processes require appropriate masking on surfaces that are not processed.

The embodiment forms the surface-processed portion 213 immediately below the resin burr 22, namely, at the base portion of the resin burr 22 on the exposed surface 12 of the thermosetting resin member 10. The surface-processed portion 213 is given an anchor effect due to the roughened surface and improves adhesiveness to the thermoplastic resin member 20.

Consequently, strong adhesiveness is generated between the resin burr 22 made of the thermoplastic resin and the exposed surface 12 formed as the surface-processed portion 213. The embodiment can eliminate the need for an additional process to remove the resin burr 22 as required by a prior art and provide the configuration and the manufacturing method appropriate for preventing loss of the resin burr 22.

The embodiment applies the surface-processed portion 213 to the base portion of the resin burr 22 and the sealed surface 11 belonging to the surface of the thermosetting resin member 10. This can provide stronger adhesiveness between the thermoplastic resin member 20 and the sealed surface 11 and provide a stable sealing configuration.

Second Embodiment

Figure 18:
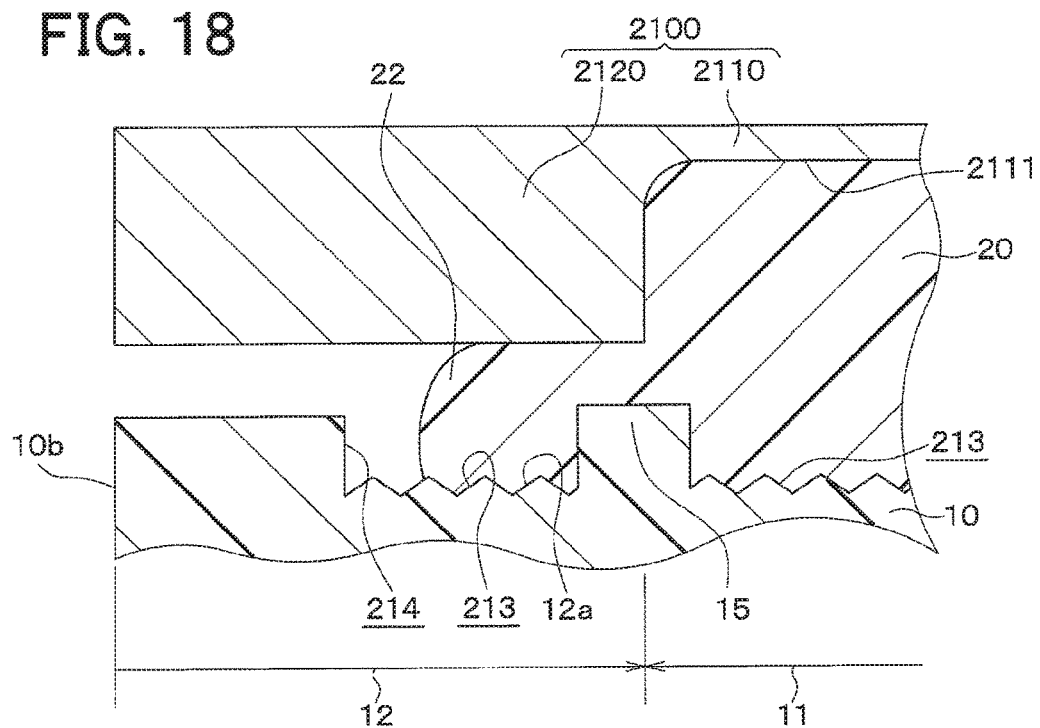
FIG. 18 is a schematic sectional view illustrating a resin molding process in the resin molded article manufacturing method according to a second embodiment of the second working example.
Figure 19:
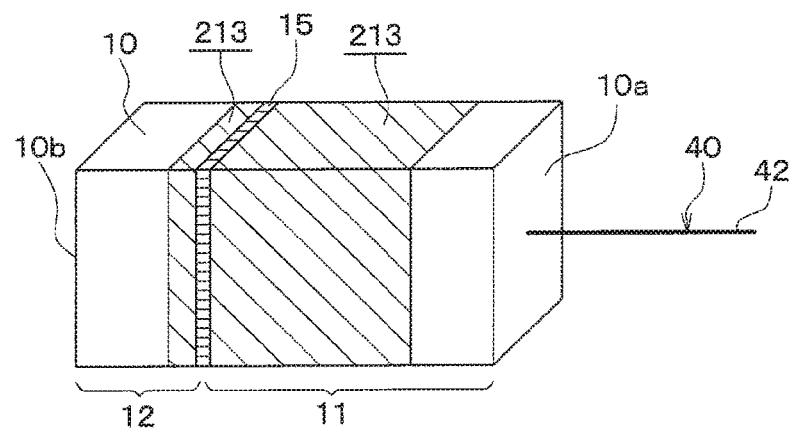
FIG. 19 is a perspective view schematically illustrating a thermosetting resin member in FIG. 18.

With reference to FIGS. 18 and 19, the description below centers on the difference between the first embodiment and the second embodiment of the second working example of the disclosure. FIG. 19 hatches surfaces of the surface-processed portion 213 and a protrusion 15 formed on the surface of the thermosetting resin member 10 for the sake of identification and convenience.

As in FIGS. 18 and 19, the semiconductor device according to the embodiment as a resin molded article includes the thermosetting resin member 10 that forms the protrusion 15 at the base portion of the resin burr 22 on the exposed surface 12 adjacently to the sealed surface 11. The protrusion 15 prevents a distance of the resin burr 22 extending toward the exposed surface 12 from the sealed surface 11.

The protrusion 15 is formed to the root of the resin burr 22 opposite the tip thereof in the pushed-out direction. As in FIG. 19, the protrusion 15 exists across the whole circumference of the thermosetting resin member 10.

The protrusion 15 protrudes to be higher than the base portion of the resin burr 22 except the protrusion 15. The protrusion 15 is also coated with the resin burr 22. The resin burr 22 is actually thinner at the protrusion 15 than the other part because of the height of the protrusion 15.

To form the protrusion 15, the surface layer corresponding to the protrusion 15 is not removed from the surface of the thermosetting resin member 10 during the preparation process that includes the process of removing the surface layer using the laser irradiation. In this case, the protrusion 15 remains unprocessed, not formed as the surface-processed portion 213, and produces a protrusion height approximately equal to the height of the level difference 214.

As the formation method of the protrusion 15, die forming, cutting, or etching is used to previously form the protrusion 15 on the surface of the thermally hardened thermosetting resin member 10. The surface layer including the protrusion 15 may be removed thereafter. In this case, the protrusion 15 is formed as the surface-processed portion 213.

The resin molding process illustrated in FIG. 18 exerts an effect of the protrusion 15 according to the embodiment. The preparation process uses the above-mentioned method of forming the protrusion 15 and prepares the thermosetting resin member 10 containing the protrusion 15 formed at the facing portion 12a of the exposed surface 12 adjacently to the sealed surface 11.

As in FIG. 18, the resin molding process injects the thermoplastic resin material while keeping the gap between the protrusion 15 and the fitting portion 2120 smaller than the gap between the facing portion 12a and the fitting portion 2120 except the protrusion 15.

The protrusion 15 narrows a gap between the fitting portion 2120 and the facing portion 12a facing the fitting portion 2120 of the die 2100 so that the gap is smaller than the other parts except the protrusion 15. The protrusion 15 limits the amount of the resin that enters the gap between the facing portion 12a and the fitting portion 2120 beyond the protrusion 15.

The protrusion 15 according to the embodiment can restrict the resin burr 22 from extending on the exposed surface 12. The height of the protrusion 15 just needs to be designed so as to limit the amount of the resin entering the gap in consideration of the time to harden the resin burr 22.

Third Embodiment

The description below explains the third embodiment of the second working example of the disclosure with reference to FIGS. 20 through 22. The embodiment provides opening direction Y1 of the die 2100 and a variation of the arrangement configuration of the surface-processed portion 213 at the facing portion 12a of the thermosetting resin member 10. The third embodiment can be combined with the above-mentioned embodiments.

Figure 20:
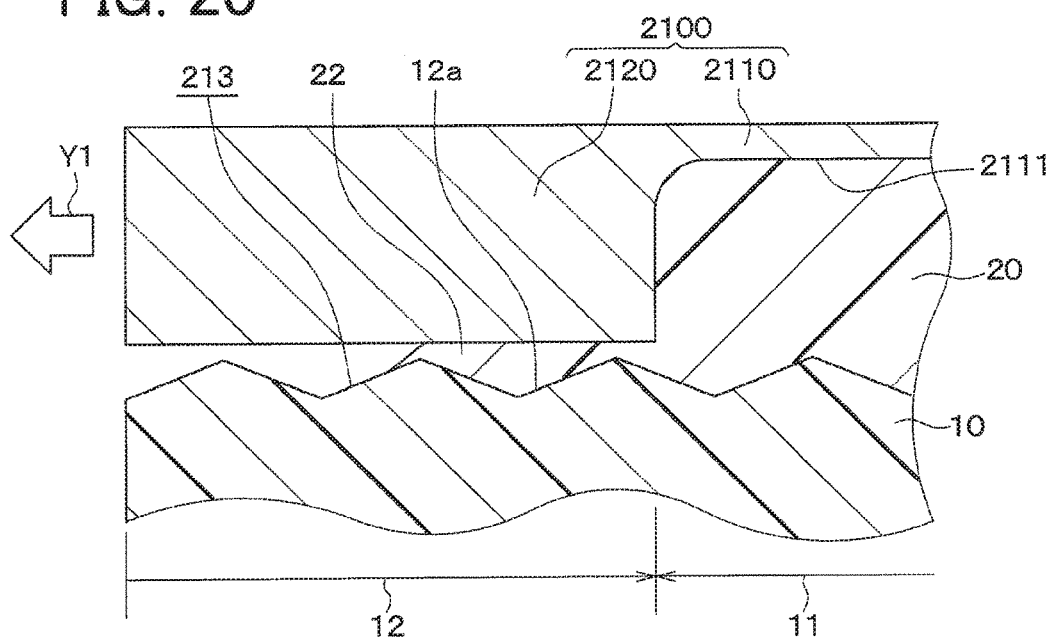
FIG. 20 is a schematic sectional view illustrating a first example of the resin molding process in the resin molded article manufacturing method according to a third embodiment of the second working example.
Figure 21:
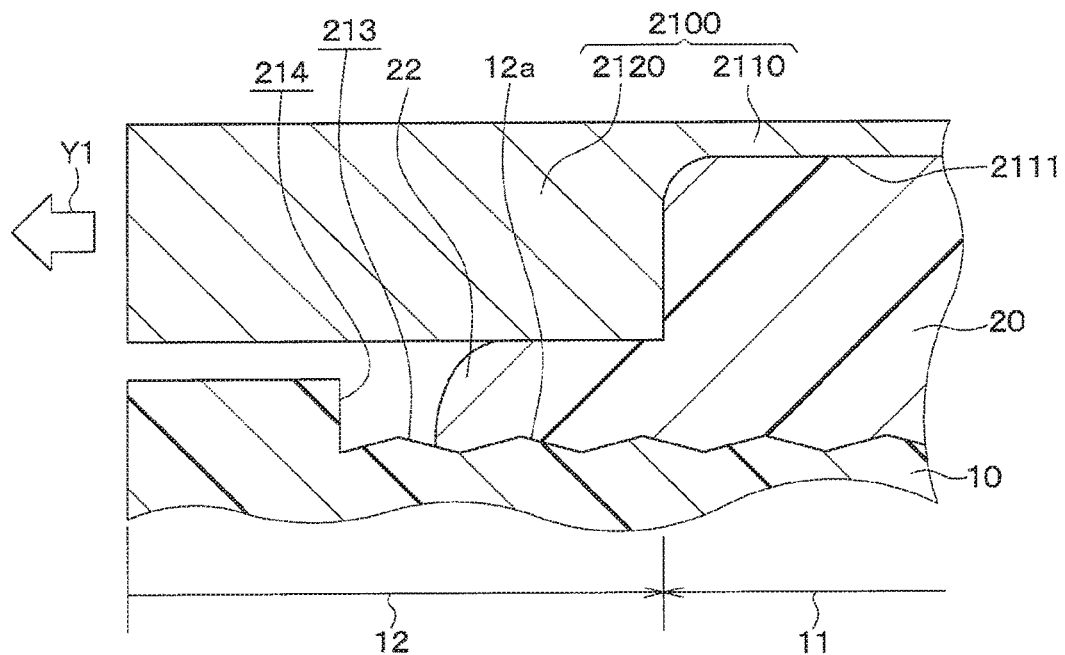
FIG. 21 is a schematic sectional view illustrating a second example of the resin molding process in the resin molded article manufacturing method according to a third embodiment of the second working example.
Figure 22:
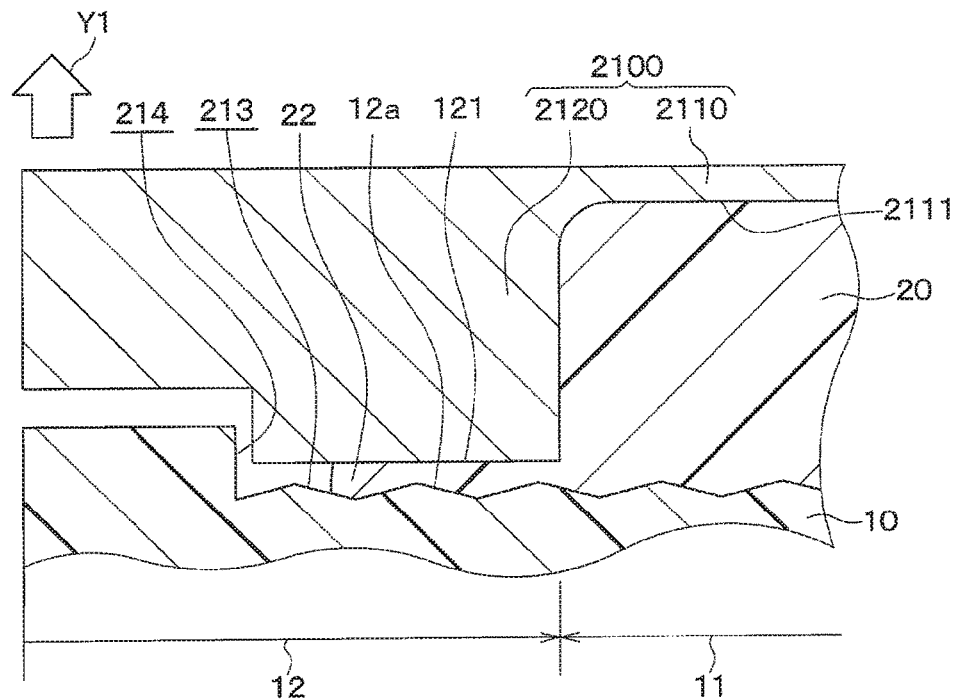
FIG. 22 is a schematic sectional view illustrating a third example of the resin molding process in the resin molded article manufacturing method according to a third embodiment of the second working example.

In FIGS. 20 through 22, a white arrow represents the opening direction Y1 of the die 2100. The die 2100 is moved in opening direction Y1 to be detached from the resin molded article after the injection molding. In FIGS. 20 and 21, the opening direction Y1 is parallel to the facing portion 12a of the thermosetting resin member 10. In FIG. 22, the opening direction Y1 is perpendicular to the facing portion 12a of the thermosetting resin member 10.

In FIG. 20, the surface-processed portion 213 is applied to the whole of the facing portion 12a in terms of the arrangement configuration of the surface-processed portion 213 at the facing portion 12a of the thermosetting resin member 10. In FIGS. 21 and 22, the surface-processed portion 213 is applied to part of the facing portion 12a toward the sealed surface 11, not to the whole of the facing portion 12a.

In FIGS. 20 and 21, opening direction Y1 of the die 2100 may be perpendicular to the facing portion 12a similarly to FIG. 22. According to the example in FIG. 21, the surface-processed portion 213 is applied to part of the facing portion 12a and the remaining part is unprocessed. The gap between the fitting portion 2120 and the surface-processed portion 213 is larger than the gap between the fitting portion 2120 and the unprocessed portion of the facing portion 12a.

FIG. 22 illustrates that opening direction Y1 is perpendicular to the facing portion 12a. In this case, a protruding surface 2121 facing the surface-processed portion 213 can be formed from the matching surface of the fitting portion 2120 so that part of the matching surface facing surface-processed portion 213 protrudes from part of the matching surface facing the unprocessed portion. The protruding surface 2121 narrows the gap between the surface-processed portion 213 and the fitting portion 2120, decreasing the amount of the resin burr 22 to be pushed out.

Other Embodiments

The embodiments of the second working example may add an unshown additive to the thermoplastic resin material included in the thermoplastic resin member 20. The additive contains a functional group that is chemically bound to the functional group existent in the surface-processed portion 213 of the thermosetting resin member 10. The additive is made of a polymer containing one or more of the hydroxyl group, the epoxide group, the amino group, and the carbonyl group.

The additive chemically reacts to the functional group such as the hydroxyl group or the epoxide group existent in the surface-processed portion 213 of the thermosetting resin member 10. This can promise an effect of enabling highly adhesive bonding between thermosetting resin and thermoplastic resin. Addition of the additive to the thermoplastic resin member 20 can further strengthen adhesiveness between the thermoplastic resin member 20 including the resin burr 22 and the thermosetting resin member 10.

In this case, the resin molding process injection-molds the thermoplastic resin material doped with the additive to the thermosetting resin member 10. For example, the thermoplastic resin material doped with the additive can be provided by kneading a polymer containing the functional group as the additive into the thermoplastic resin material as a base material.

The thermoplastic resin member 20 thereby seals the thermosetting resin member 10 while chemically binding a functional group existent in the surface-processed portion 213 to a functional group existent in the additive contained in the thermoplastic resin material.

Suppose that the thermosetting resin member 10 is made of an epoxy resin. In this case, the hydroxyl group or the epoxide group in the epoxy resin chemically binds to the hydroxyl group, the epoxide group, the amino group, or the carbonyl group existent in the additive. Binding between hydroxyl groups or epoxide groups signifies covalent binding that provides stronger chemical binding. The covalent binding is available by using a constituent material of the additive so that the constituent material contains at least one functional group equal to the one contained in the constituent material of the thermosetting resin member 10.

In the embodiments, the surface-processed portion 213 may be formed only at the base portion of the resin burr 22 on the exposed surface 12 belonging to the surface of the thermosetting resin member 10. The surface-processed portion 213 may not be formed on the sealed surface 11. The surface-processed portion 213 may be formed only at the facing portion 12a that is likely to generate the resin burr 22 on the exposed surface 12 belonging to the surface of the thermosetting resin member 10. The surface-processed portion 213 may not be formed on the sealed surface 11.

In the embodiments, the surface-processed portion 213 may be formed all over the sealed surface 11 and the exposed surface 12. Namely, the surface-processed portion 213 may be formed all over the surface of the thermosetting resin member 10.

When the resin burr 22 is generated at a predetermined region, the surface-processed portion 213 may be formed on only part of the exposed surface 12 toward the sealed surface 11 as described. Similarly, the surface-processed portion 213 may be formed on only part of the sealed surface 11. However, the surface-processed portion 213 is favorably formed all over the sealed surface 11 to contribute to the ease of preventing a contaminated object such as moisture or oil from penetrating from the surface boundary between the thermosetting resin member 10 and the thermoplastic resin member 20 that are exposed.

The surface-processed portion 213 just needs to be processed by the surface treatment so that the surface-processed portion 213 increases adhesiveness to the thermoplastic resin member 20 compared to the other part than the surface-processed portion 213 on the thermosetting resin member 10. The surface-processed portion 213 is not limited to the above-mentioned roughened surface to which the roughening process is applied. If possible, the surface-processed portion 213 according to the embodiments may be processed by the surface treatment using chemicals to improve adhesiveness to the thermoplastic resin member 20.

The sealed component just needs to be sealed with the thermosetting resin member 10. The sealed component is not limited to the semiconductor device 30, the electric connection member 40, or the circuit board described above.

The shape of the thermosetting resin member 10 according to the embodiments is not limited to cuboid as described. The thermosetting resin member 10 may be formed into a spherical shape or an indefinite shape. The thermoplastic resin member 20 just needs to satisfy the sealing configuration so that the surface of the thermosetting resin member 10 is partly sealed and the remaining part is exposed. The sealing configuration is not limited to the illustrated example in which one end 10a of the thermosetting resin member 10 provides the sealed surface 11 and the other end thereof provides the exposed surface.

According to the embodiments, the resin molded article is provided as a semiconductor device. The inside of the thermosetting resin member 10 is provided with the semiconductor device 30 as a sealed component sealed with the thermosetting resin member 10. However, the resin molded article is not limited to the semiconductor device. The thermosetting resin member 10 may be configured to be void of the sealed component.

Third Working Example

First Embodiment

Figure 23:
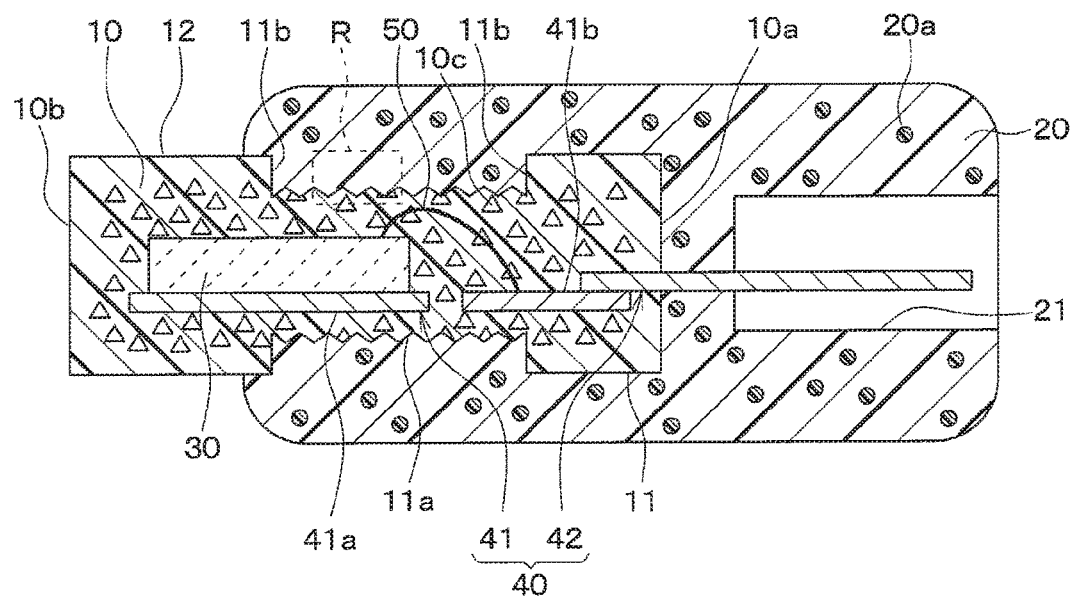
FIG. 23 is a perspective view schematically illustrating a thermosetting resin member contained in the semiconductor device as a resin molded article according to a first embodiment of a third working example of the disclosure.
Figure 24:
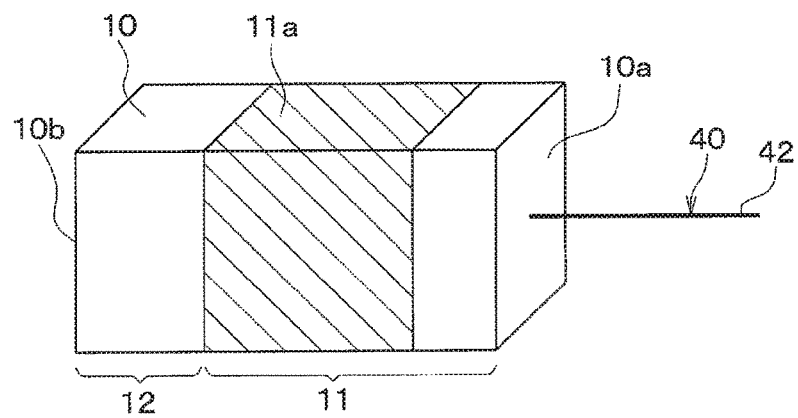
FIG. 24 is a perspective view schematically illustrating a thermosetting resin member in the semiconductor device in FIG. 23.

With reference to FIGS. 23 and 24, the description below explains the resin molded article according to the first embodiment of a third working example of the disclosure. FIG. 23 greatly simplifies the uneven shape of a surface removal portion 11a (referred to as a roughened surface) formed on the surface of the thermosetting resin member 10 and the height of the level difference 11b for ease of comprehension. FIG. 24 diagonally hatches the surface of the surface removal portion 11a formed on the surface of the thermosetting resin member 10.

The resin molded article is used as a semiconductor device that is mounted on vehicles such as automobiles and drives various vehicular electronic devices. The semiconductor device as the resin molded article according to the embodiment includes the thermosetting resin member 10 and the thermoplastic resin member 20 that partially seals the surface of the thermosetting resin member 10.

The thermosetting resin member 10 is made of thermosetting resin such as epoxy resin and contains a catalyst 10c mixed in. The catalyst 10c changes the constituent material (constituent element) of the functional group-containing additive 20a added to the thermoplastic resin member 20 (to be described later) to an unstable or reactive state so that the functional group contained in the functional group-containing additive 20a reacts more actively. The catalyst 10c depends on a combination with the constituent material of the functional group-containing additive 20a. For example, a phosphorous catalyst such as TPP (triphenylphosphine) is used when the functional group-containing additive 20a is made of an epoxy resin. When the epoxy resin is used, the use of TPP as the catalyst 10c causes a ring-opening reaction to cleave the epoxide group contained in the epoxy resin. The epoxide group can be activated as a functional group. The content percentage of the catalyst 10c in the thermosetting resin member 10 is adjusted appropriately based on the constituent material of the functional group-containing additive 20a or the amount of the functional group-containing additive 20a contained in the thermoplastic resin member 20.

Where necessary, the thermosetting resin member 10 may allow the resin to contain a filler including an insulating material such as silica or alumina. This type of thermosetting resin member 10 is formed by performing a molding process such as the transfer molding, the compression molding, or the potting method and a thermoset process.

The thermoplastic resin member 20 is made of thermoplastic resin such as PPS (polyphenylene sulfide) or PBT (polybutylene terephthalate). The thermoplastic resin member 20 is formed by performing injection molding so as to partially seal the thermosetting resin member 10. The thermoplastic resin member 20 is doped with a functional group-containing additive 20a. The functional group-containing additive 20a is made of a polymer containing one or more of a hydroxyl group, an epoxide group, an amino group, and a carbonyl group. The functional group-containing additive 20a chemically reacts to a functional group on the surface of the surface removal portion 11a of the thermosetting resin member 10 and enables highly adhesive bonding between thermosetting resin and thermoplastic resin.

The thermoplastic resin member 20 containing the functional group-containing additive 20a partially seals the surface of the thermosetting resin member 10. Part of the surface of the thermosetting resin member 10 provides the sealed surface 11 sealed with the thermoplastic resin member 20. The remaining part of the surface of the thermosetting resin member 10 except the sealed surface 11 provides the exposed surface 12 exposed from the thermoplastic resin member 20.

As in FIGS. 23 and 24, the thermosetting resin member 10 is configured as a cuboid block. The sealed surface 11 corresponds to part of the surface of the thermosetting resin member 10 at one end 10a of the thermosetting resin member 10 in a longer direction. The exposed surface 12 corresponds to the remaining part of the surface of the thermosetting resin member at the other end 10b in the longer direction.

More specifically, the thermosetting resin member 10 in FIGS. 23 and 24 forms a cuboid that includes one end face and the other end opposite this in the longer direction and four sides extending in the longer direction. The sealed surface 11 of the thermosetting resin member 10 corresponds to the one end 10a in the longer direction along which the one end face and the four sides are available. The exposed surface 12 of the thermosetting resin member 10 corresponds to the other end 10b in the longer direction along which the other end face and the four sides are available.

The thermosetting resin member 10 contains inside the semiconductor device 30 sealed with the thermosetting resin member 10 and the electric connection member 40 as a sealed component.

The semiconductor device 30 is provided as a sensor chip that includes a silicon semiconductor and is used for a magnetic sensor, an optical sensor, or a pressure sensor. An ordinary semiconductor process fabricates the semiconductor device 30.

For example, the thermosetting resin member 10 entirely seals the semiconductor device 30 for magnetic sensors. The semiconductor device 30 detects external magnetism via the thermosetting resin member 10.

An unshown aperture is formed in the thermosetting resin member 10 to partially open the semiconductor device 30 for optical sensors or pressure sensors. The semiconductor device 30 detects light or pressure via the aperture.

The electric connection member 40 as the sealed component electrically connects the semiconductor device 30 with an unshown wiring member outside the semiconductor device. The electric connection member 40 includes a lead frame 41 and a terminal 42. Part of the lead frame 41 is provided as a mount portion 41a of the semiconductor device 30. The remaining part is provided as a terminal portion 41b pulled outside the thermosetting resin member 10. The mount portion 41a and part of the terminal portion 41b are coated with the thermosetting resin member 10. The remaining part of the terminal portion 41b protrudes from the sealed surface 11 of the thermosetting resin member 10. One end of the terminal 42 is electrically and physically bonded to the remaining part of the terminal portion 41b by welding. The terminal 42 as well as the remaining part of the terminal portion 41b is sealed with the thermoplastic resin member 20 outside the thermosetting resin member 10. The other end of the terminal 42 is exposed from the thermoplastic resin member 20.

The terminal portion 41b of the lead frame 41 is electrically connected to the semiconductor device 30 inside the thermosetting resin member 10. A bonding wire 50 made of Al or Au is used for connection to the semiconductor device 30 though the connection technique is not limited thereto.

The thermoplastic resin member 20 seals the remaining part 42 of the terminal portion 41b of the electric connection member 40 and one end of the terminal 42. The thermoplastic resin member 20 includes the aperture 21 formed at the other end of the terminal 42. The other end of the terminal 42 is exposed outside the thermoplastic resin member 20 in the aperture 21.

The aperture 21 of the thermoplastic resin member 20 provides a region where an unshown external wiring member such as a connector member is inserted for connection. This allows the external wiring member and the terminal 42 to be connected electrically.

The semiconductor device 30 uses the electric connection member 40 that functions as detection or output. The semiconductor device 30 allows the electric connection member 40 to enable electrical interconnection with the outside of the device. According to the embodiment, the electric connection member 40 uses a terminal including a rod-like member made of Cu or Al. A circuit board may be used as the electric connection member 40.

In the semiconductor device 30 according to the embodiment, the surface layer removal process removes the surface layer up to a specified thickness (e.g., 50 µm) or more from part of the sealed surface 11 of the thermosetting resin member 10 to form a surface removal portion 11a. According to the embodiment, the surface removal portion 11a is provided as a roughened surface roughened by the surface layer removal process. The surface removal portion 11a indicates a roughening degree (surface roughness Ra) greater than that of the sealed surface 11 and the exposed surface 12 other than the surface removal portion 11a. Specifically, the surface removal portion 11a indicates surface roughness Ra of several micrometers or more (e.g., 3 µm or more). Surface roughness Ra corresponds to arithmetic mean roughness Ra defined in JIS (Japanese Industrial Standards).

As described, the thermosetting resin member 10 is formed as the exposed surface 12 exposed from the thermoplastic resin member 20 at the other end 10b. The other end of the terminal portion 41b of the lead frame 41 protrudes from the sealed surface 11 of the thermosetting resin member 10 and is sealed with the thermoplastic resin member 20. The sealed surface 11 is located between the exposed surface 12 of the thermosetting resin member 10 and the other end of the terminal portion 41b. The sealed surface 11 includes the surface removal portion 11a to form a continuous closed-ring shape around the terminal portion 41b.

As in FIG. 24, the other end of the terminal portion 41b protrudes from the one end face of the cuboid thermosetting resin member 10. The surface removal portion 11a is provided based on the arrangement pattern as a closed ring pattern that continues over four sides of the cuboid thermosetting resin member 10.

According to the embodiment, as in FIGS. 23 and 24, the surface removal portion 11a is formed only inside the sealed surface 11 of the thermosetting resin member 10, namely, only inside the thermoplastic resin member 20. The end of the surface removal portion 11a is positioned inside the thermoplastic resin member 20.

Figure 25:
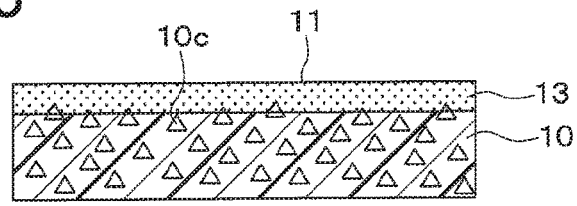
FIG. 25 is an enlarged view of area R included in the sectional view of a manufacturing process of the semiconductor device in FIG. 23.

As described, the surface removal portion 11a is formed by entirely removing the surface layer 13 (see FIG. 25) of the sealed surface 11. The surface removal portion 11a is dented against the other part of the surface of the thermosetting resin member 10 and forms the level difference 11b between the surface removal portion 11a and the other part of the surface thereof. The height of the level difference 11b is several micrometers or more (e.g., 5 μm or more), or favorably, 50 μm or more.

The semiconductor device manufacturing method according to the embodiment will be described also with reference to FIGS. 25 through 28. A hardening mold process as in FIG. 25 uses a thermosetting resin material as a raw material for the thermosetting resin member 10. The hardening mold process heats and completely hardens the thermosetting resin material to form the thermosetting resin member 10.

Specifically, the hardening mold process performs transfer molding, compression molding, or potting to seal the semiconductor device 30 and the terminal portion 41b connected with each other through the bonding wire 50. The hardening mold process further heats and hardens the sealed whole of the semiconductor device 30 and the terminal portion 41b. The thermosetting resin member 10 is thus fabricated.

The surface layer 13 containing a contaminated object exists as a topmost surface of the thermosetting resin member 10 formed by the hardening mold process. The contaminated object is contained in a constituent material of the thermosetting resin member 10. The contaminated object floats over the topmost surface during heat molding and rarely exists inward. The contaminated object includes a mold release agent or a foreign matter attached to the surface of the thermosetting resin member 10 during the process. The mold release agent is provided for the die surface or is mixed into the thermosetting resin material to ensure a demolding property during the molding. The mold release agent is made of siloxane or fatty acid. The thermosetting resin member 10 contains the catalyst 10c mixed in. The catalyst 10c rarely exists in the surface layer 13 of the thermosetting resin member 10 and exists inward thereof.

Figure 26:
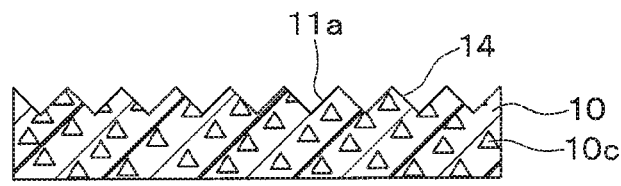
FIG. 26 is an enlarged view of area R in FIG. 23 as a sectional view of the manufacturing process following FIG. 25.
Figure 27:
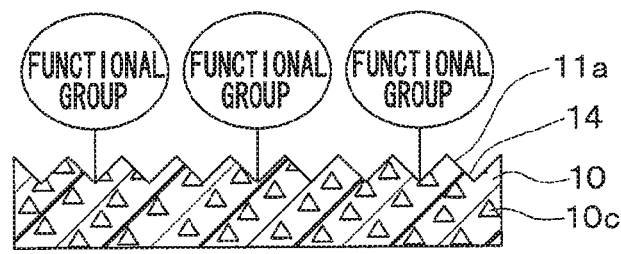
FIG. 27 is an enlarged view of area R in FIG. 23 as a sectional view of the manufacturing process following FIG. 26.

As in FIG. 26, the surface layer removal process is applied to the thermosetting resin member 10. The process removes the surface layer 13 on the topmost surface from part of the sealed surface 11 of the thermosetting resin member 10, namely, a region of the sealed surface 11 to form the surface removal portion 11a and thereby forms the region as the newly formed surface 14.

Specifically, the process removes the surface layer 13 from a position targeted to form the surface removal portion 11a of the sealed surface 11 using a technique such as laser irradiation, shot blast, or polishing. These techniques shave the processed surface to form irregularities. The laser irradiation is the most desirable technique. The sealed surface 11 just needs to be removed to form the surface removal portion 11a approximately as deep as several micrometers or more (e.g., 5 μm or more), favorably 50 μm, so as to be able to remove the surface layer 13.

These techniques remove the surface layer 13 as the contaminated object and forms the surface removal portion 11a. The surface of the surface removal portion 11a forms the newly formed surface 14 as a base for the surface layer 13. As described, the technique such as laser irradiation forms the newly formed surface 14 that is therefore roughened and provides a roughened surface. The newly formed surface 14 is thereby available as a surface that is given an anchor effect and excels in adhesion to the thermoplastic resin member 20. Actually, as in FIG. 27, the newly formed surface 14 as the surface of the surface removal portion 11a includes one or more functional groups such as a hydroxyl group and an epoxide group in the thermosetting resin that configures the thermosetting resin member 10.

The catalyst 10c mixed in the thermosetting resin member 10 is exposed from the newly formed surface 14 as the surface of the surface removal portion 11a. When the surface removal portion 11a is not formed, the catalyst 10c is embedded inward of the surface of the thermosetting resin member 10 as described. The catalyst 10c is hardly exposed to the surface. However, the embodiment removes the surface layer 13 to form the surface removal portion 11a and thereby removes part of the surface of the thermosetting resin member 10 covering the catalyst 10c up to a specified thickness. The catalyst 10c is exposed from the newly formed surface 14.

In particular, the laser irradiation is advantageously used for the surface layer removal process. This is because the newly formed surface 14 is burnt and the functional group at a burnt and oxidized portion further stimulates a chemical reaction to provide high adhesion. It is also advantageous to apply corona discharge treatment to the newly formed surface 14 of the thermosetting resin member 10 so that the newly formed surface 14 contains as many functional groups such as an OH group as possible.

Figure 28:
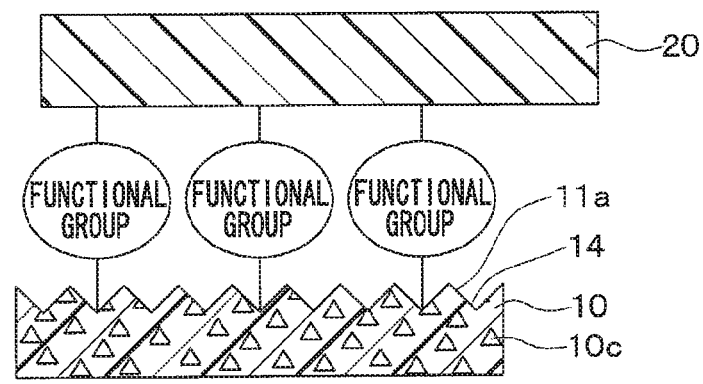
FIG. 28 is an enlarged view of area R in FIG. 23 as a sectional view of the manufacturing process following FIG. 27.

The surface layer removal process is followed by a plasticizing mold process in FIG. 28. This process injection-molds a thermoplastic resin material on the newly formed surface 14 containing the functional group of the thermosetting resin member 10. The thermoplastic resin material is doped with the functional group-containing additive 20a as a raw material for the thermoplastic resin member 20. For example, the thermoplastic resin material doped with the functional group-containing additive 20a can result from kneading a polymer containing the functional group as the functional group-containing additive 20a into the thermoplastic resin material as a base material. The thermoplastic resin member 20 thereby seals the sealed surface 11 of the thermosetting resin member 10 while chemically binding a functional group on the newly formed surface 14 to a functional group in the functional group-containing additive 20a contained in the thermoplastic resin material.

The plasticizing mold process causes chemical binding as follows. Suppose that the thermosetting resin member 10 is made of an epoxy resin. The hydroxyl group or the epoxide group in the epoxy resin is chemically bound to the hydroxyl group, the epoxide group, the amino group, or the carbonyl group in the functional group-containing additive 20a. Binding between hydroxyl groups or epoxide groups signifies covalent binding that provides stronger chemical binding. The covalent binding is available by using a constituent material of the functional group-containing additive 20a so that the constituent material contains at least one functional group equal to the one contained in the constituent material of the thermosetting resin member 10.

The chemical binding enables high adhesion between the newly formed surface 14 (i.e., surface removal portion 11a)

of the thermosetting resin member 10 and thermoplastic resin member 20. As described, the surface layer 13 is removed from the thermosetting resin member 10 to expose the catalyst 10c from the newly formed surface 14. This moreover activates the functional group of the functional group-containing additive 20a added to the thermoplastic resin member 20. The functional group can react with the functional group exposed from the newly formed surface 14 of the thermosetting resin member 10 to provide higher adhesion.

It is favorable to decrease an additive amount of the functional group-containing additive 20a. This is because increasing the additive amount of the functional group-containing additive 20a added to the thermoplastic resin member 20 may degrade characteristics of the thermoplastic resin member 20. Contrastingly, the embodiment can decrease the additive amount of the functional group-containing additive 20a added to the thermoplastic resin member 20 by exposing the catalyst 10c from the newly formed surface 14 to activate the functional group in the functional group-containing additive 20a and provide higher adhesion. This can also prevent characteristics of the thermoplastic resin member 20 from degrading by reducing the additive amount of the functional group-containing additive 20a.

The semiconductor device as the resin molded article according to the embodiment is thus fabricated. Processes subsequent to the surface layer formation process selectively process parts of the surface of the thermosetting resin member 10. The processes require appropriate masking on surfaces that are not processed.

The manufacturing method forms the newly formed surface 14 by removing the contaminated object from the sealed surface 11 at a surface boundary between the sealed surface 11 of the thermosetting resin member 10 and the thermoplastic resin member 20 sealing the sealed surface 11. The newly formed surface 14 provides chemical binding between the thermosetting resin member 10 and the thermoplastic resin member 20 via the functional group.

The chemical binding enables high adhesion between the thermosetting resin member 10 and the thermoplastic resin member 20. In particular, exposing the catalyst 10c from the newly formed surface 14 can moreover activate the functional group in the functional group-containing additive 20a and provide higher adhesion. The embodiment can improve the adhesion between the thermosetting resin member 10 and the thermoplastic resin member 20.

The sealing configuration for the thermoplastic resin member 20 according to the embodiment may allow a penetrant substance such as external moisture or a contaminated object to penetrate into the device along the surface boundary between the thermosetting resin member 10 and the thermoplastic resin member 20 from the end of the boundary between the sealed surface 11 and the exposed surface 12. In particular, a contaminated object such as moisture or oil existent in the usage environment may penetrate into the onboard semiconductor device according to the embodiment.

According to the embodiment, the terminal portion 41b of the electric connection member 40 as a sealed component protrudes from the sealed surface 11 of the thermosetting resin member 10 and is sealed with the thermoplastic resin member 20. In this case, the penetrant substance may stick to the terminal portion 41b. The penetrant substance may adversely affect characteristics of the semiconductor device including the resin molded article.

To solve this, the embodiment provides the surface removal portion 11a to form the closed-ring shape for a region that belongs to the sealed surface 11 of the thermosetting resin member 10 and is located between the exposed surface 12 and the terminal portion 41b protruding from the sealed surface 11.

The closed-ring shape provides the region that ensures high adhesion and prevents the separation as described. The embodiment can possibly prevent the penetrant substance from reaching the terminal portion 41b from the exposed surface 12 through the surface boundary between both resin members 10 and 20.

Figure 29:
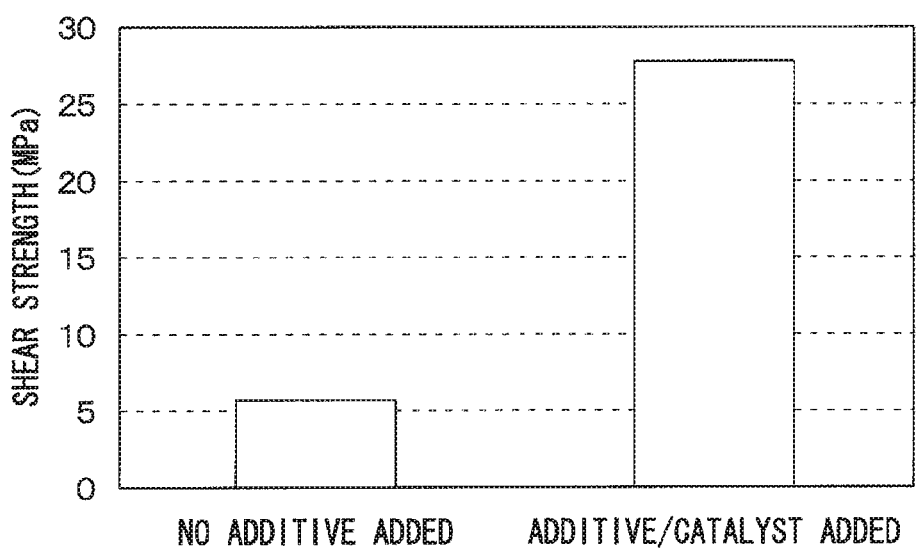
FIG. 29 is a diagram illustrating an effect of the semiconductor device manufacturing method according to the first embodiment of the third working example.
Figure 30:
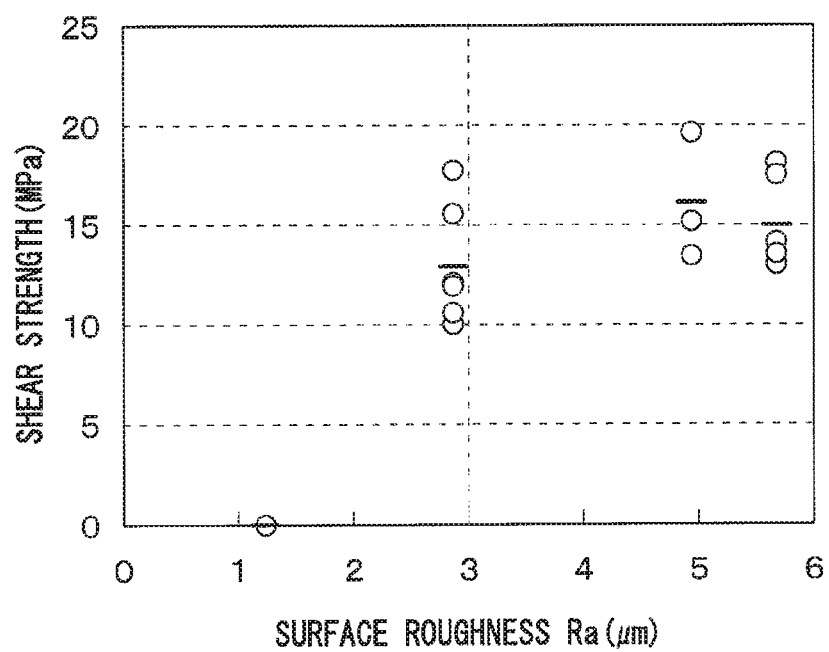
FIG. 30 is a diagram illustrating an effect of the semiconductor device manufacturing method according to the first embodiment of the third working example.
Figure 31:
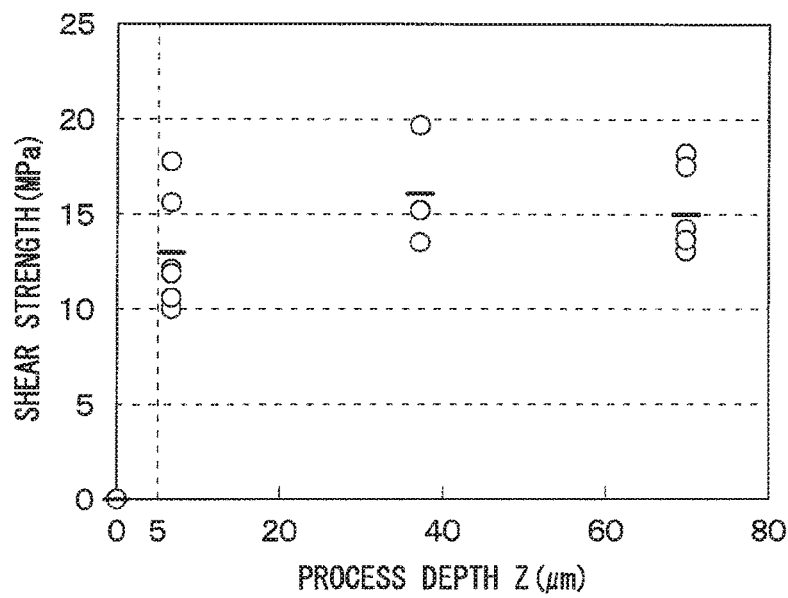
FIG. 31 is a diagram illustrating an effect of the semiconductor device manufacturing method according to the first embodiment of the third working example.

The description below more specifically explains effects of removing the surface layer 13 and improving the adhesion between both resin members 10 and 20 due to chemical binding with reference to FIGS. 29 through 31. FIGS. 29 through 31 illustrate only examples of the effect of improving the adhesion. The effect is not limited thereto.

In the examples of FIGS. 29 through 31, one rectangular plate-like test piece corresponds to the thermosetting resin member 10 and is made of thermosetting resin. The other rectangular plate-like test piece corresponds to the thermoplastic resin member 20 and is made of thermoplastic resin. A resin molded article was fabricated based on the manufacturing method so that both test pieces are bonded. The shear strength (unit: MPa) was measured at a part of bonding both test pieces.

In the experiment according to the example of FIG. 29, an ordinary epoxy resin for semiconductor device sealing was transfer-molded as the thermosetting resin material and then laser irradiation was applied to the surface to form the newly formed surface 14 including the surface removal portion 11a. PPS was injection-molded as a thermoplastic resin material to configure a structure of thermosetting resin member 10 sealed with the thermoplastic resin member 20. The structure was prepared depending on whether the catalyst 10c or an epoxy resin comparable to the functional group-containing additive 20a is added to the thermosetting resin material or the thermoplastic resin material. The shear strength was evaluated for each structure. FIG. 29 illustrates an evaluation result.

As in FIG. 29, a great increase in the shear strength, namely, the adhesion between both resin members 10 and 20 was found when the catalyst 10c or the functional group-containing additive 20a is added according to the embodiment in comparison with the case of not adding the catalyst 10c or the functional group-containing additive 20a. Specifically, the shear strength remains approximately 5 MPa when the catalyst 10c or the functional group-containing additive 20a is not added. Contrastingly, the shear strength increases to 27 MPa when the catalyst 10c or the functional group-containing additive 20a is added. According to our conclusion, no functional group causes chemical binding and the adhesion is not improved when the catalyst 10c or the functional group-containing additive 20a is not added. The functional group causes chemical binding and the adhesion is improved when the catalyst 10c or the functional group-containing additive 20a is added.

FIGS. 30 and 31 illustrate investigations into relation between surface roughness Ra (unit: μm) of the surface removal portion 11a and the shear strength and relation between process depth Z (unit: μm) and the shear strength, respectively, when the surface layer removal process uses a laser irradiation technique. In the drawings, a circle represents each experiment result. A bar represents an average value of experiment results when surface roughness Ra or process depth Z is identical. Process depth Z corresponds to the height of the level difference 11b. The laser irradiation applies a laser beam to the surface to scan the surface and remove the surface layer 13.

As in FIGS. 30 and 31, the laser irradiation is supposed to provide sufficient adhesion strength when the surface layer removal process is performed on condition of Ra≥3 μm and Z≥5 μm.

Similar experiments were conducted using shot blast and polishing as well as the laser irradiation. The shot blast sprays Alundum (alumina powder #80) onto the surface to remove the surface layer 13. The polishing is performed as hand polishing (manual hand polishing) using polishing paper (#80) to remove the surface layer 13. It was confirmed that these techniques also provide sufficient adhesion strength when the surface removal process includes a process similarly to the laser irradiation.

According to the experiment result, the adhesion decreases in the order of the laser irradiation, the shot blast, and the polishing. This is probably because the laser irradiation burns the newly formed surface 14 and the functional group at a burnt and oxidized portion further stimulates a chemical reaction to provide high adhesion. Any technique is applicable if it can remove the surface layer 13. However, the laser irradiation is advantageous if high adhesion strength is needed. Obviously, the shot blast or the polishing is also applicable if it can provide surface roughness Ra and process depth Z comparable to the laser irradiation.

According to the embodiment, the level difference 11b of the surface removal portion 11a ensures the height of several micrometers or more (e.g., 5 μm or more), favorably 50 μm. The purpose is to reliably expose the catalyst 10c from the newly formed surface 14. An experiment was conducted to measure exposure states of the catalyst 10c in a case where the surface removal portion 11a is not formed, a case where the height of the level difference 11b is set to 5 μm or lower, and a case where the height of the level difference 11b is set to 50 μm to 80 μm. Specifically, the thermosetting resin member 10 was soaked in acetone and then IR (infrared ray) irradiation was applied to perform peak measurement on the surface of the thermosetting resin member 10 when not forming the surface removal portion 11a or on the surface of the surface removal portion 11a when formed. Exposure states of the catalyst 10c were measured.

Figure 32:
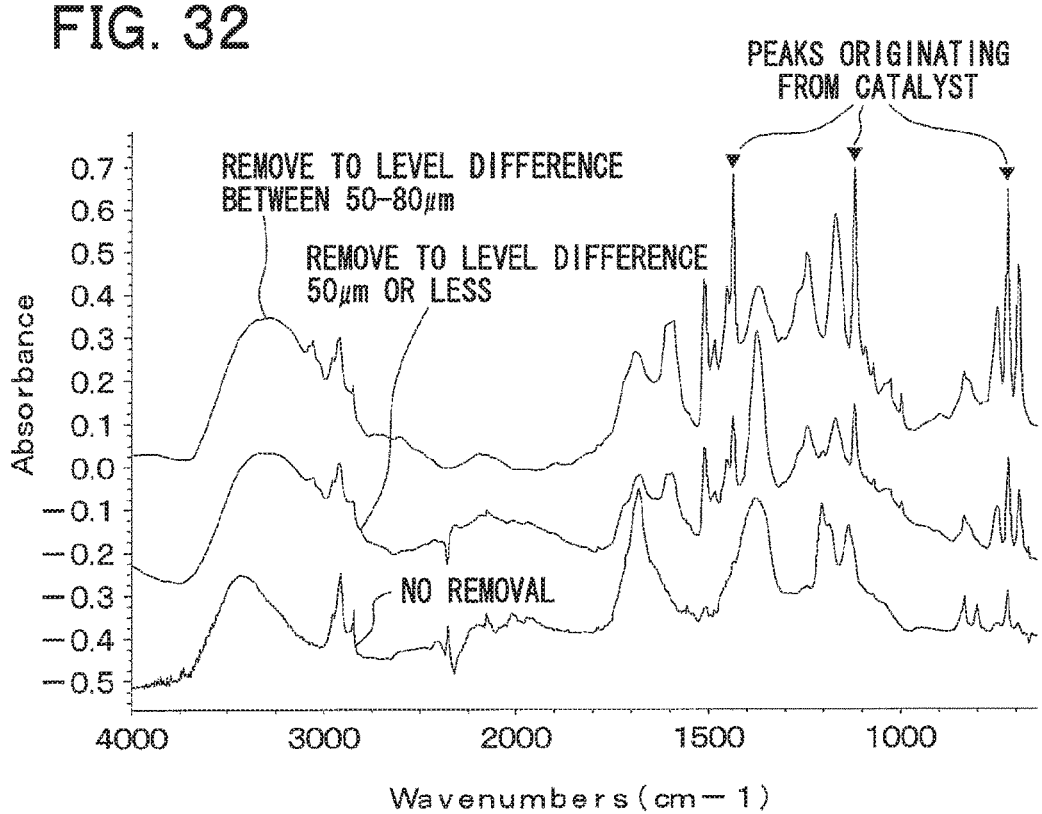
FIG. 32 is a diagram illustrating results of measuring exposed states of a catalyst depending on cases where no surface removal portion is formed and a surface removal portion is formed and the height of a level difference is varied.

Consequently, as in FIG. 32, no peak originates from the catalyst 10c when the surface removal portion 11a is not formed. Small peaks originate from the catalyst 10c when the surface removal portion 11a is formed but the elimination quantity is small and the height of the level difference 11b is 5 μm or less. Contrastingly, large peaks originate from the catalyst 10c and the catalyst 10c is reliably exposed when the surface removal portion 11a is formed and the elimination quantity ranges between 50 μm and 80 μm.

Providing the surface removal portion 11a can expose the catalyst 10c. The catalyst 10c can be more reliably exposed when the elimination quantity is set to several micrometers or more, favorably 50 μm or more. This can reliably ensure the effect resulting from exposing the catalyst 10c.

Second Embodiment

Figure 33:
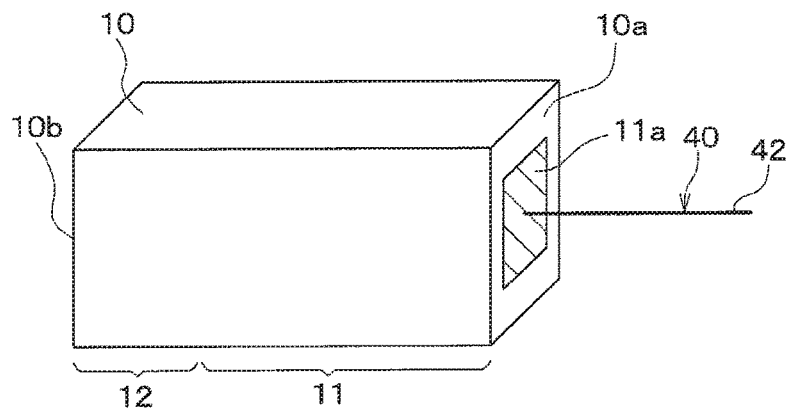
FIG. 33 is a perspective view schematically illustrating a thermosetting resin member contained in the semiconductor device as a resin molded article according to a second embodiment of the third working example of the disclosure.

With reference to FIG. 33, the description below explains a major part of the semiconductor device as the resin molded article according to the second embodiment of the third working example of the disclosure. The second embodiment differs from the first embodiment of the third working example in a changed arrangement pattern of the surface removal portion 11a of the thermosetting resin member 10. The description below centers on the difference.

According to the first embodiment of the third working example, as in FIG. 24, the surface removal portion 11a is provided based on the arrangement pattern as a closed ring pattern that continues over four sides of the cuboid thermosetting resin member 10.

According to the second embodiment, as in FIG. 33, the surface removal portion 11a is arranged only on one end face, namely, the end face of the cuboid thermosetting resin member 10 at one end 10a.

Also in this case, the arrangement pattern of the surface removal portion 11a is provided as a closed-ring shape that surrounds the terminal portion 41b protruding from the one end face as the sealed surface 11. The second embodiment also provides the effect of the closed ring pattern similarly to the first embodiment of the third working example.

Other Embodiments

According to the embodiments of the third working example, as in FIGS. 23, 24, and 33, the surface removal portion 11a is provided for part of the sealed surface 11 of the thermosetting resin member 10. The surface removal portion 11a may be provided for the whole of the sealed surface 11. Namely, the surface removal portion 11a may be provided for at least part of the sealed surface 11.

The surface removal portion 11a may be formed up to the exposed surface 12 in addition to the sealed surface 11. Further, the surface removal portion 11a may be formed over the entire surface of the thermosetting resin member 10.

As described, the surface removal portion 11a is provided for part of the sealed surface 11 favorably in a continuous closed ring pattern as the arrangement pattern. Moreover, the surface removal portion 11a may be provided for the sealed surface 11 so as to be island shaped.

In FIG. 23, the surface removal portion 11a is provided within the range of the sealed surface 11. Therefore, the level difference 11b is sealed inside the thermoplastic resin member 20. However, the surface removal portion 11a may be continuously formed up to part of the exposed surface 12 beyond the sealed surface 11 of the thermosetting resin member 10. In this case, the level difference 11b is exposed from the thermoplastic resin member and is visible.

The sealed component just needs to be sealed with the thermosetting resin member 10 and is not limited to the electric connection member 40. The sealed component also includes the semiconductor device 30 and the circuit board.

The shape of the thermosetting resin member 10 is not limited to cuboid as described. The thermosetting resin member 10 may be formed into a spherical shape or an indefinite shape. The thermoplastic resin member 20 just needs to satisfy the sealing configuration so that the surface of the thermosetting resin member 10 is partly sealed and the remaining part is exposed. The sealing configuration is not limited to the illustrated example in which one end 10a of the thermosetting resin member 10 provides the sealed surface 11 and the other end thereof provides the exposed surface.

According to the embodiments, the resin molded article is provided as a semiconductor device. The inside of the thermosetting resin member 10 is provided with the semiconductor device 30 as a sealed component sealed with the thermosetting resin member 10. However, the resin molded article is not limited to the semiconductor device. The thermosetting resin member 10 may be configured to be void of the sealed component.

Fourth Working Example

First Embodiment

Figure 34:
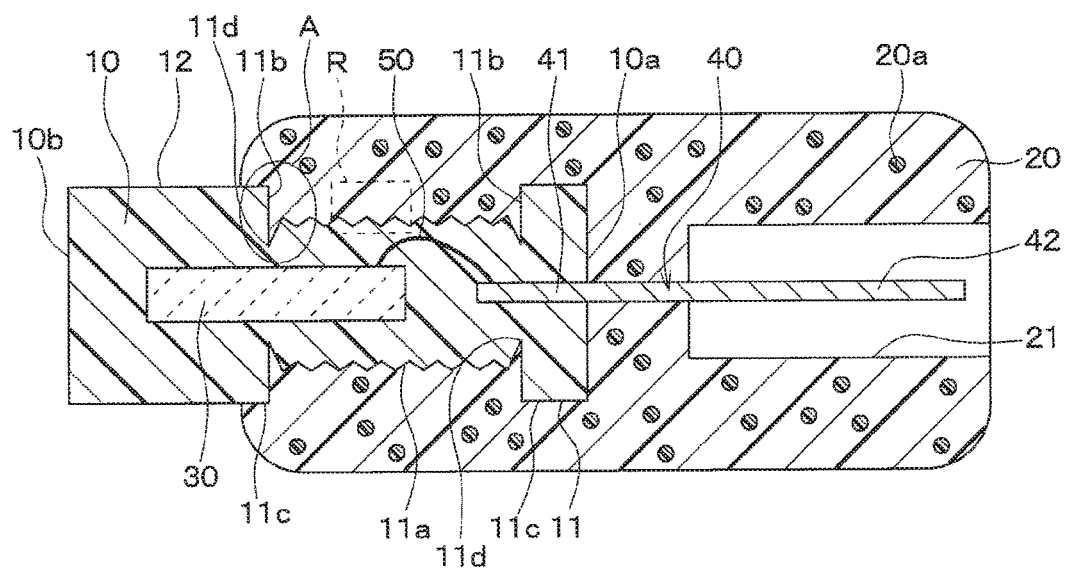
FIG. 34 is a perspective view schematically illustrating a thermosetting resin member contained in the semiconductor device as a resin molded article according to a first embodiment of a fourth working example of the disclosure.
Figure 35:
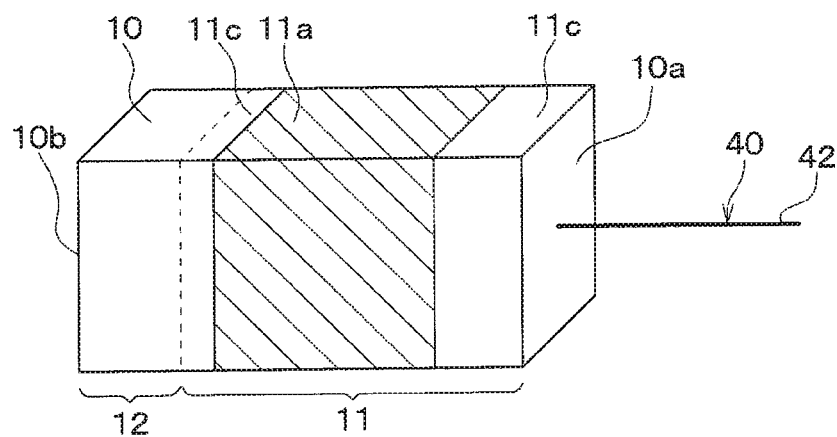
FIG. 35 is a perspective view schematically illustrating a thermosetting resin member in the semiconductor device in FIG. 34.
Figure 36:
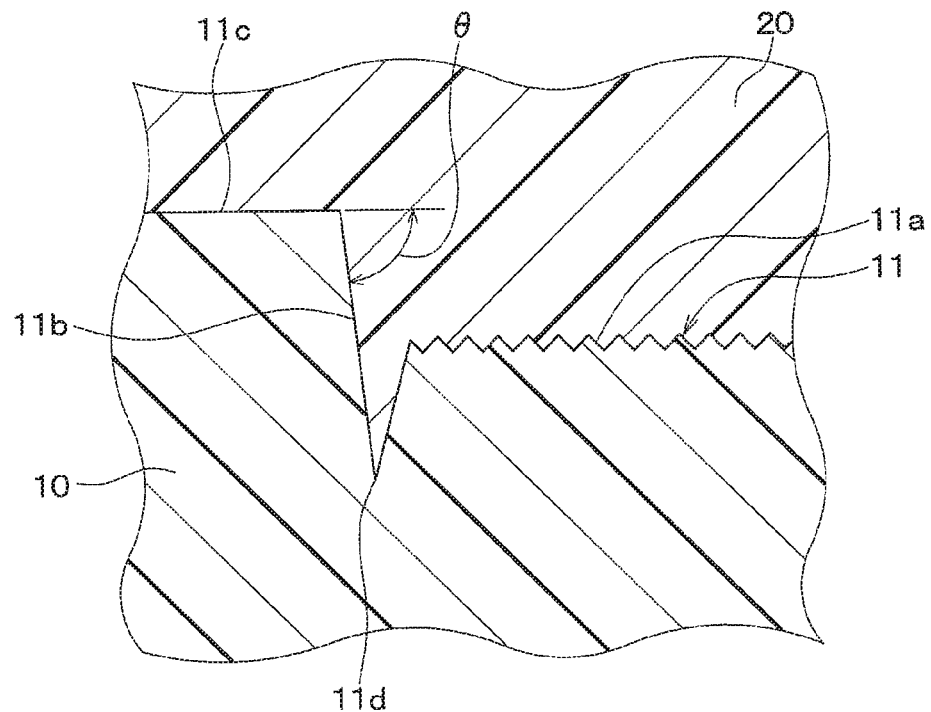
FIG. 36 is a schematic sectional view illustrating an enlarged detail of circled part A in FIG. 34.

With reference to FIGS. 34 through 36, the description below explains the resin molded article according to the first embodiment of a fourth working example of the disclosure. FIGS. 34 and 36 greatly simplify the uneven shape of the roughened surface 11a formed on the surface of the thermosetting resin member 10, the level difference 11b, and a groove 11d for ease of comprehension. FIG. 35 diagonally hatches the surface of the roughened surface 11a formed on the surface of the thermosetting resin member 10. FIG. 36 omits the additive 20a in the thermoplastic resin member 20.

The resin molded article is used as a semiconductor device that is mounted on vehicles such as automobiles and drives various vehicular electronic devices. The semiconductor device as the resin molded article according to the embodiment includes the thermosetting resin member 10 and the thermoplastic resin member 20 that partially seals the surface of the thermosetting resin member 10.

The thermosetting resin member 10 is made of thermosetting resin such as epoxy resin. The thermosetting resin member 10 may contain a filler made of an insulating material such as silica or alumina as needed in the resin. The thermosetting resin member 10 is formed by performing molding such as transfer molding, compression molding, or the potting method and a thermoset process.

The thermoplastic resin member 20 is made of thermoplastic resin such as PPS (polyphenylene sulfide) or PBT (polybutylene terephthalate). The thermoplastic resin member 20 is formed by performing injection molding so as to partially seal the thermosetting resin member 10. The thermoplastic resin member 20 is doped with the additive 20a containing a functional group.

The additive 20a is made of a polymer containing one or more of functional groups such as a hydroxyl group, an epoxide group, an amino group, and a carbonyl group. The additive 20a chemically reacts to a functional group on the roughened surface 11a of the thermosetting resin member 10 and enables highly adhesive bonding between thermosetting resin and thermoplastic resin.

The thermoplastic resin member 20 containing the additive 20a partially seals the surface of the thermosetting resin member 10. Part of the surface of the thermosetting resin member 10 provides the sealed surface 11 sealed with the thermoplastic resin member 20. The remaining part of the surface of the thermosetting resin member 10 except the sealed surface 11 provides the exposed surface 12 exposed from the thermoplastic resin member 20.

As in FIGS. 34 and 35, the thermosetting resin member 10 is configured as a cuboid block. The sealed surface 11 corresponds to part of the surface of the thermosetting resin member 10 at one end 10a of the thermosetting resin member 10 in a longer direction. The exposed surface 12 corresponds to the remaining part of the surface of the thermosetting resin member at the other end 10b in the longer direction.

More specifically, the thermosetting resin member 10 in FIGS. 34 and 35 forms a cuboid that includes one end face and the other end opposite this in the longer direction and four sides extending in the longer direction.

The sealed surface 11 of the thermosetting resin member 10 corresponds to the one end 10a in the longer direction along which the one end face and the four sides are available. The exposed surface 12 of the thermosetting resin member 10 corresponds to the other end 10b in the longer direction along which the other end face and the four sides are available.

The thermosetting resin member 10 contains inside the semiconductor device 30 as a first sealed component and the electric connection member 40 as a second sealed component both sealed with the thermosetting resin member 10.

The semiconductor device 30 as the first sealed component is provided as a sensor chip that includes a silicon semiconductor and is used for a magnetic sensor, an optical sensor, or a pressure sensor. An ordinary semiconductor process fabricates the semiconductor device 30.

For example, the thermosetting resin member 10 entirely seals the semiconductor device 30 for magnetic sensors. The semiconductor device 30 detects external magnetism via the thermosetting resin member 10.

An unshown aperture is formed in the thermosetting resin member 10 to partially open the semiconductor device 30 for optical sensors or pressure sensors. The semiconductor device 30 detects light or pressure via the aperture.

The embodiment partially exposes the thermosetting resin member 10 sealing the semiconductor device 30 from the thermoplastic resin member 20. This prevents an excess stress from being applied to the semiconductor device 30.

The electric connection member 40 as the second sealed component electrically connects the semiconductor device 30 with an unshown wiring member outside the semiconductor device. The thermosetting resin member 10 coats a part 41 of the electric connection member 40. A remaining part 42 protrudes from the sealed surface 11 of the thermosetting resin member 10. The thermoplastic resin member 20 seals the remaining part 42 of the electric connection member 40 outside the thermosetting resin member 10. In addition, the tip of the remaining part 42 is exposed from the thermoplastic resin member 20.

The part 41 of the electric connection member 40 is electrically connected to the semiconductor device 30 inside the thermosetting resin member 10. A bonding wire 50 made of Al or Au is used for connection to the semiconductor device 30 though the connection technique is not limited thereto.

The thermoplastic resin member 20 seals the remaining part 42 of the electric connection member 40. The aperture 21 is formed in the thermoplastic resin member 20. The remaining part 42 of the electric connection member 40 is partially exposed outside the thermoplastic resin member 20 in the aperture 21.

The aperture 21 of the thermoplastic resin member 20 provides a region where an unshown external wiring member such as a connector member is inserted for connection. This allows the external wiring member and the electric connection member 40 to be connected electrically.

The semiconductor device 30 uses the electric connection member 40 that functions as detection or output. The semiconductor device 30 allows the electric connection member 40 to enable electrical interconnection with the outside of the device. According to the embodiment, the electric connection member 40 uses a terminal including a rod-like member made of Cu or Al. A circuit board may be used as the electric connection member 40.

As in FIGS. 34 through 36, according to the embodiment, part of the sealed surface 11 of the thermosetting resin member 10 is formed into the roughened surface 11a to which a roughening process is applied. The remaining part of the sealed surface 11 is formed into a non-roughened surface 11c to which no roughening process is applied. The roughened surface 11a is recessed to generate the level difference 11b to be lower than the non-roughened surface 11c. The roughened surface 11a is rougher than the non-roughened surface 11c.

The non-roughened surface 11c is not roughened. Similarly to the non-roughened surface 11c, the exposed surface 12 of the thermosetting resin member 10 is not roughened either. The non-roughened surface 11c and the exposed surface 12 maintain the same state and are formed continuously while the former is sealed with the thermoplastic resin member 20 and the latter is exposed.

The roughened surface 11a is formed by the surface layer removal process of the manufacturing method to be described later. The roughened surface 11a indicates a roughening degree (surface roughness Ra) greater than that of the non-roughened surface 11c and the exposed surface 12.

Figure 37:
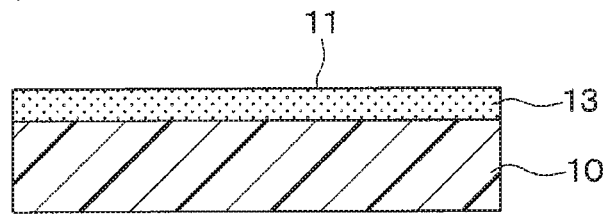
FIG. 37 is an enlarged view of area R included in the sectional view of a manufacturing process of the semiconductor device in FIG. 34.

Specifically, the roughened surface 11a indicates surface roughness Ra of several micrometers or more (e.g., 3 μm or more). The non-roughened surface 11c and the exposed surface 12 correspond to the surface where the surface layer 13 (see FIG. 37) exists (to be described later). Surface roughness Ra corresponds to arithmetic mean roughness Ra defined in JIS (Japanese Industrial Standards).

As described, the remaining part 42 of the electric connection member 40, namely the second sealed component, protrudes from the sealed surface 11 of the thermosetting resin member 10 and is sealed with the thermoplastic resin member 20.

The sealed surface 11 is located between the exposed surface 12 of the thermosetting resin member 10 and the remaining part 42 of the electric connection member 40. The sealed surface 11 is provided with the roughened surface 11a so as to form a continuous closed-ring shape around the remaining part 42 of the electric connection member 40.

As in FIG. 35, the remaining part 42 of the electric connection member 40 protrudes from one end face of the cuboid thermosetting resin member 10. The roughened surface 11a is arranged to form a closed ring pattern that continues over four sides of the cuboid thermosetting resin member 10.

According to the embodiment, as in FIGS. 34 and 35, the roughened surface 11a is formed only inside the sealed surface 11 of the thermosetting resin member 10, namely, only inside the thermoplastic resin member 20. Both ends of the roughened surface 11a are positioned inside the thermoplastic resin member 20.

As described, the roughened surface 11a is formed by entirely removing the surface layer 13 (see FIG. 37) of the sealed surface 11. The roughened surface 11a is dented against the other part of the surface of the thermosetting resin member 10 and forms the level difference 11b between the roughened surface 11a and the other part of the surface thereof. The height of the level difference 11b, namely, a difference between the non-roughened surface height and the roughened surface height is several micrometers or more (e.g., 5 μm or more).

According to the embodiment, the thermoplastic resin member 20 seals both ends of the roughened surface 11a. A boundary between the roughened surface 11a and the non-roughened surface 11c exists at both ends of the roughened surface 11a. The embodiment provides two boundaries on the sealed surface 11.

[Groove for Separation Prevention]
According to the embodiment, as in FIG. 34, the groove 11d for separation prevention is provided at the boundary between the non-roughened surface 11c and the roughened surface 11a of the sealed surface 11. The groove 11d is located between the non-roughened surface 11c and the roughened surface 11a and prevents the separation from extending to the roughened surface 11a when the separation occurs at the surface boundary between the non-roughened surface 11c and the thermoplastic resin member 20. The groove will be described also with reference to FIG. 36.

The groove 11d bends an extension pathway of the separation to the roughened surface 11a and increases a creepage distance between the non-roughened surface 11c and the roughened surface 11a when the separation occurs at the surface boundary between the non-roughened surface 11c and the thermoplastic resin member 20.

Specifically, the groove 11d is deeply cut and is depressed to be lower than the roughened surface 11a and the non-roughened surface 11c. The groove 11d is deeper than a level difference between irregularities on the roughened surface 11a (namely, the level difference height between the irregularities).

According to the embodiment, the groove 11d is arranged in a closed ring pattern continuously formed across the four sides of the cuboid thermosetting resin member 10 at two boundaries between the roughened surface 11a and the non-roughened surface 11c of the sealed surface 11.

As in FIG. 36, the groove 11d is formed as a V-shaped groove whose width narrows in the depth direction according to a sectional view. The groove 11d is formed at the level difference 11b. The non-roughened surface 11c, the level difference 11b, the groove 11d, and the roughened surface 11a are arranged continuously.

An inner wall surface of the groove 11d to the non-roughened surface 11c is therefore configured to extend a wall surface of the level difference 11b to the bottom of the groove 11d. The inner wall surface and the wall surface of the level difference 11b are actually formed as the same tilted surface. The inner wall surface of the groove 11d to the roughened surface 11a is adjacent to the roughened surface 11a.

As in FIG. 36, angle θ is formed between the inner wall surface of the groove 11d to the non-roughened surface 11c and the non-roughened surface 11c. Angle θ is favorably larger than 45 degrees. It is favorable to allow the inner wall surface of the groove 11d to be steeper against the non-roughened surface 11c. The groove 11d according to the embodiment is formed as a V-shaped groove and is able to easily provide steepness.

[Manufacturing Method]
The description below explains the semiconductor device manufacturing method according to the embodiment also with reference to FIGS. 37 through 40. A hardening mold process as in FIG. 37 uses a thermosetting resin material as a raw material for the thermosetting resin member 10. The hardening mold process heats and completely hardens the thermosetting resin material to form the thermosetting resin member 10.

Specifically, the hardening mold process performs transfer molding, compression molding, or potting to seal the semiconductor device 30 and the electric connection member 40 connected with each other through the bonding wire 50. The hardening mold process further heats and hardens the sealed whole of the semiconductor device 30 and the electric connection member 40. The thermosetting resin member 10 is thus fabricated.

The surface layer 13 containing a contaminated object exists as a topmost surface of the thermosetting resin member 10 formed by the hardening mold process. The contaminated object is contained in a constituent material of the thermosetting resin member 10. The contaminated object floats over the topmost surface during heat molding and rarely exists inward. The contaminated object includes a mold release agent or a foreign matter attached to the surface of the thermosetting resin member 10 during the process. The mold release agent is provided for the die surface or is mixed into the thermosetting resin material to ensure a demolding property during the molding. The mold release agent is made of siloxane or fatty acid.

Figure 38:
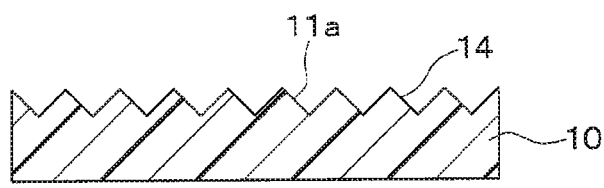
FIG. 38 is an enlarged view of area R in FIG. 34 as a sectional view of the manufacturing process following FIG. 37.
Figure 39:
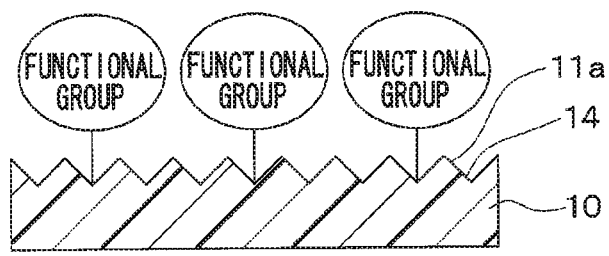
FIG. 39 is an enlarged view of area R in FIG. 34 as a sectional view of the manufacturing process following FIG. 38.
Figure 40:
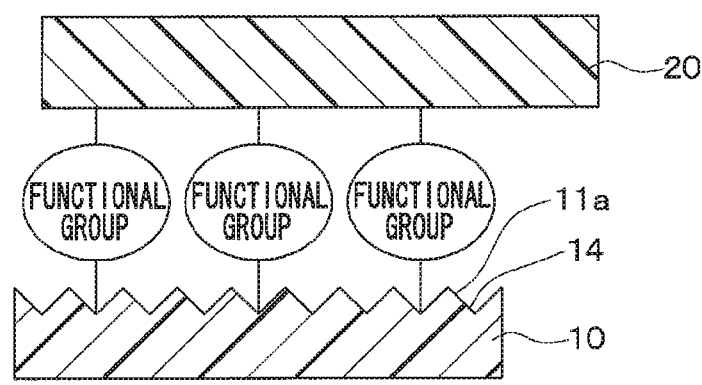
FIG. 40 is an enlarged view of area R in FIG. 34 as a sectional view of the manufacturing process following FIG. 39.

As in FIG. 38, the surface layer removal process is applied to the thermosetting resin member 10. The process removes the surface layer 13 on the topmost surface from part of the sealed surface 11 of the thermosetting resin member 10, namely, a region of the sealed surface 11 to form the roughened surface 11a and thereby forms the region as a newly formed surface 14.

Specifically, the process removes the surface layer 13 from a position targeted to form the roughened surface 11a of the sealed surface 11 using a technique such as laser irradiation, shot blast, or polishing. These techniques shave the processed surface to form irregularities. The laser irradiation is the most desirable technique. The sealed surface 11 just needs to be removed to form the roughened surface 11a approximately as deep as several micrometers or more (e.g., 5 μm or more) so as to be able to remove the surface layer 13.

These techniques remove the surface layer 13 as the contaminated object and roughen the newly formed surface 14 as a base for the surface layer 13. The newly formed surface 14 is thereby available as the roughened surface 11a that is given an anchor effect and excels in adhesion to the thermoplastic resin member 20. Actually, as in FIG. 39, the newly formed surface 14 as the roughened surface 11a includes one or more functional groups such as a hydroxyl group and an epoxide group in the thermosetting resin that configures the thermosetting resin member 10.

In particular, the laser irradiation is advantageously used for the surface layer removal process. This is because the newly formed surface 14 is burnt and the functional group at a burnt and oxidized portion further stimulates a chemical reaction to provide high adhesion. It is also advantageous to apply corona discharge treatment to the newly formed surface 14 of the thermosetting resin member 10 so that the newly formed surface 14 contains as many functional groups such as an OH group as possible.

After the surface layer removal process is performed, the groove 11d is formed at the region corresponding to the boundary between the non-roughened surface 11c and the roughened surface 11a of the sealed surface 11 (groove formation process), though not shown. The groove 11d is formed by using the laser irradiation to cut the surface of the thermosetting resin member 10. The femtosecond laser can easily form the steep groove 11d as described.

When molding the thermosetting resin member 10, the hardening mold process may slightly recess a region to form the groove 11d in the thermosetting resin member 10 in advance. The groove formation process is then performed to form the groove 11d using the laser The groove formation process is followed by a plasticizing mold process in FIG. 40. The process injection-molds a thermoplastic resin material onto the roughened surface 11a as the newly formed surface 14 of the thermosetting resin member 10 containing functional groups. The thermoplastic resin material is doped with the additive 20a as a raw material for the thermoplastic resin member 20.

For example, the thermoplastic resin material doped with the additive 20a can result from kneading a polymer containing the functional group as the additive 20a into the thermoplastic resin material as a base material. The thermoplastic resin member 20 thereby seals the sealed surface 11 of the thermosetting resin member 10 while chemically binding a functional group on the roughened surface 11a to a functional group in the additive 20a.

The plasticizing mold process causes chemical binding as follows. Suppose that the thermosetting resin member 10 is made of an epoxy resin. The hydroxyl group or the epoxide group in the epoxy resin is chemically bound to the hydroxyl group, the epoxide group, the amino group, or the carbonyl group in the additive 20a.

Binding between hydroxyl groups or epoxide groups signifies covalent binding that provides stronger chemical binding. The covalent binding is available by using a constituent material of the functional group-containing additive 20a so that the constituent material contains at least one functional group equal to the one contained in the constituent material of the thermosetting resin member 10.

The chemical binding enables high adhesion between the roughened surface 11a as the newly formed surface 14 of the thermosetting resin member 10 and thermoplastic resin member 20. The semiconductor device as the resin molded article according to the embodiment is thus fabricated.

Processes subsequent to the surface layer formation process selectively process parts of the surface of the thermosetting resin member 10. The processes require appropriate masking on surfaces that are not processed.

[Effects]

The embodiment forms the roughened surface 11a as the newly formed surface 14 by removing the contaminated object from the sealed surface 11 at a surface boundary between the sealed surface 11 of the thermosetting resin member 10 and the thermoplastic resin member 20 sealing the sealed surface 11. The roughened surface 11a provides chemical binding between the thermosetting resin member 10 and the thermoplastic resin member 20 via the functional group.

The chemical binding enables high adhesion between the thermosetting resin member 10 and the thermoplastic resin member 20. The embodiment can improve the adhesion between the thermosetting resin member 10 and the thermoplastic resin member 20.

According to the embodiment, the groove 11d bends the surface boundary between the sealed surface 11 and the thermoplastic resin member 20 at the boundary between the non-roughened surface 11c and the roughened surface 11a. Namely, an extension pathway of the separation to the roughened surface 11a is bent when the separation occurs at the surface boundary between the non-roughened surface 11c and the thermoplastic resin member 20. This can decrease a stress intensity factor concerning the separation. Decreasing the stress intensity factor relieves concentration of the separation stress.

The groove 11d extends the creepage distance between the non-roughened surface 11c and the roughened surface 11a. The embodiment can prevent the separation from extending to the roughened surface 11a at the boundary between the roughened surface 11a and the non-roughened surface 11c when the thermoplastic resin member 20 causes the separation from the non-roughened surface 11c of the sealed surface 11 of the thermosetting resin member 10.

As described, the laser irradiation entirely removes the surface layer 13 from the sealed surface 11 to provide the roughened surface 11a. Immediately after the surface layer removal process, the level difference 11b is formed between the roughened surface 11a and the non-roughened surface 11c. An angle of up to 45 degrees is formed between the wall surface of the level difference 11b and the non-roughened surface 11c. Depending on how much the groove 11d increases the creepage distance, however, this measure of the angle insufficiently decreases the stress intensity factor concerning the separation and may not be able to prevent the separation from extending.

According to the embodiment, forming the groove 11d enables angle θ of 45 degrees or larger between the non-roughened surface 11c and the inner wall surface of the groove 11d to the non-roughened surface 11c. This angle θ corresponds to a bend degree of the extension pathway for the separation. Increasing angle θ decreases the stress intensity factor concerning the separation. The embodiment can greatly decrease the stress intensity factor concerning the separation and reliably prevent the separation from extending.

Second Embodiment

Figure 41:
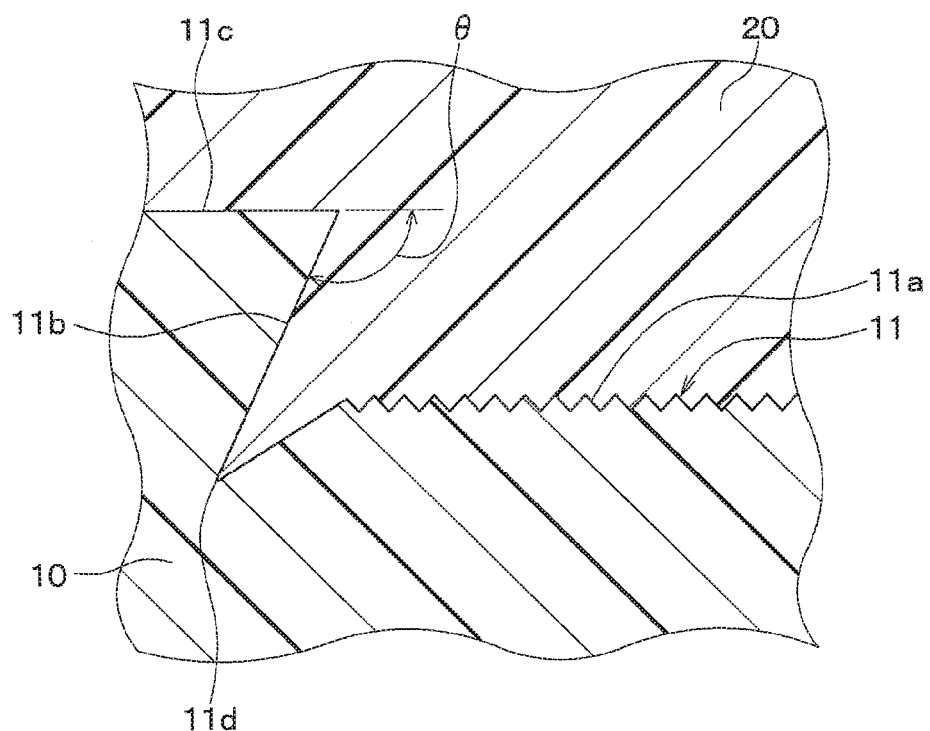
FIG. 41 is a schematic sectional view illustrating a major part of the semiconductor device according to a second embodiment of the fourth working example of the disclosure.

With reference to FIG. 41, the description below explains a second embodiment of the fourth working example of the disclosure. FIG. 41 illustrates the vicinity of the boundary between the non-roughened surface 11c and the roughened surface 11a a major part of the semiconductor device 30 according to the embodiment. The description of the embodiment centers on a difference from the first embodiment of the fourth working example.

As in FIG. 36, the first embodiment of the fourth working example provides angle θ of 45 degrees or larger between the non-roughened surface 11c and the inner wall surface of the groove 11d to the non-roughened surface 11c. The femtosecond laser can form the groove 11d as steep as approximately 85 through 90 degrees.

As in FIG. 41, the second embodiment configures the groove 11d by allowing angle θ to be an obtuse angle larger than 90 degrees such as 100 degrees or larger. The groove 11d based on this angle θ according to the embodiment can be formed by obliquely irradiating the femtosecond laser onto the surface.

The embodiment can provide the effect of preventing the separation from extending similarly to the first embodiment of the fourth working example. Increasing angle θ can moreover decrease the stress intensity factor concerning the separation and favorably prevent the separation.

Third Embodiment

Figure 42:
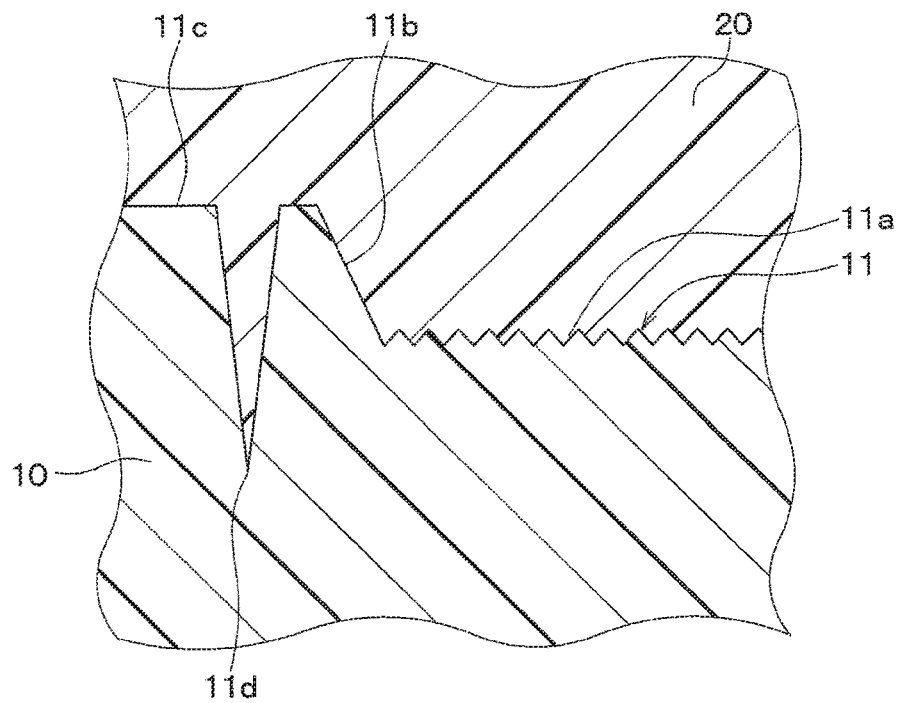
FIG. 42 is a schematic sectional view illustrating a major part of the semiconductor device according to a third embodiment of the fourth working example of the disclosure.

With reference to FIG. 42, the description below explains a third embodiment of the fourth working example of the disclosure and centers on a difference from the first embodiment of the fourth working example.

According to the embodiment, as in FIG. 42, the V-shaped groove 11d for separation prevention is also provided for the boundary between the non-roughened surface 11c and the roughened surface 11a of the sealed surface 11. The groove 11d is located between the non-roughened surface 11c and the roughened surface 11a. According to the first embodiment of the fourth working example, the groove 11d is provided to be continuous with the roughened surface 11a. According to the third embodiment, the groove 11d is provided for the sealed surface 11 to keep a specified distance from the end of the roughened surface 11a.

The laser irradiation such as femtosecond laser also forms the groove 11d according to the embodiment similarly to the first embodiment of the fourth working example. The embodiment also provides the effect similar to the first embodiment of the fourth working example. Separating the groove 11d from the roughened surface 11a increases the creepage distance between the non-roughened surface 11c and the roughened surface 11a, favorably preventing the separation from extending.

Obviously, the configuration of the embodiment, namely separating the groove 11d from the roughened surface 11a, can be combined with the second embodiment of the fourth working example that uses the groove 11d based on angle θ larger than 90 degrees.

Fourth Embodiment

Figure 43:
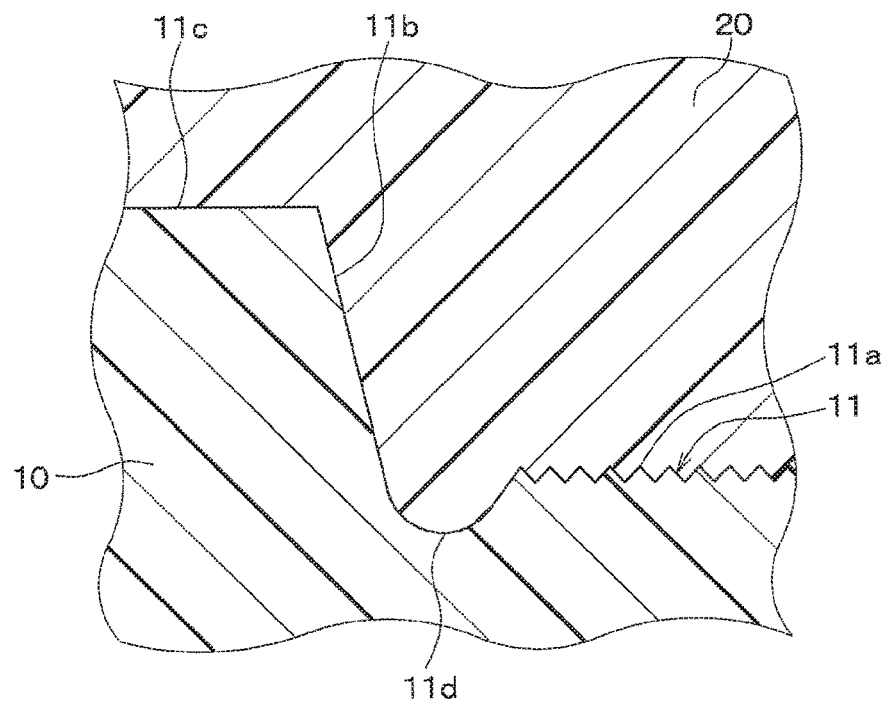
FIG. 43 is a schematic sectional view illustrating a major part of the semiconductor device according to a fourth embodiment of the fourth working example of the disclosure.

With reference to FIG. 43, the description below explains a fourth embodiment of the fourth working example of the disclosure and centers on a difference from the first embodiment of the fourth working example.

As in FIG. 43, the embodiment uses the U-shaped groove 11d for separation prevention whose sectional view is U-shaped while the first embodiment of the fourth working example uses the V-shaped groove. The U-shaped groove 11d is formed by slowly rotating an object to shape the groove bottom into a curved surface while low-power laser irradiation is performed.

The embodiment also provides the effect similar to the first embodiment of the fourth working example. The V-shaped groove 11d provides a steeper bend degree at the bottom than the U-shaped groove, favorably preventing the separation.

The U-shaped groove 11d according to the embodiment can also increase angle θ to be larger than 90 degrees by adjusting a laser irradiation angle. The embodiment can be combined with the second embodiment of the fourth working example. Obviously, the U-shaped groove 11d can be also separated from the roughened surface 11a similarly to the third embodiment of the fourth working example.

Fifth Embodiment

Figure 44:
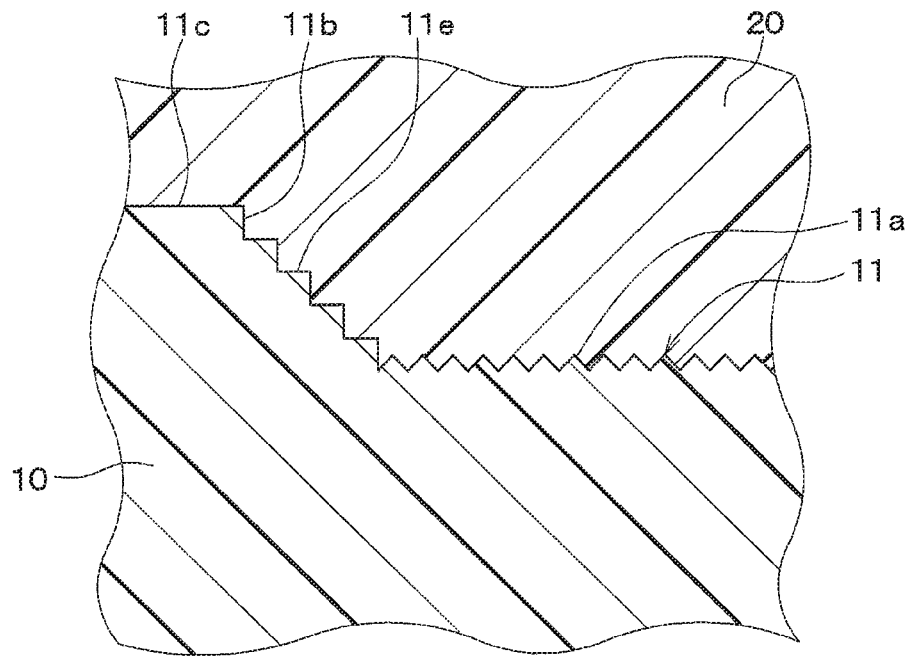
FIG. 44 is a schematic sectional view illustrating a major part of the semiconductor device according to a fifth embodiment of the fourth working example of the disclosure.

With reference to FIG. 44, the description below explains a fifth embodiment of the fourth working example of the disclosure and centers on a difference from the first embodiment of the fourth working example. As in FIG. 44, the embodiment applies an unevenness process to a wall surface 11e at the level difference 11b between the non-roughened surface 11c and the roughened surface 11a of the sealed surface 11 instead of forming the groove 11d according to the first embodiment of the fourth working example.

The unevenness process prevents the separation from extending to the roughened surface 11a when the separation occurs at the surface boundary between the non-roughened surface 11c and the thermoplastic resin member 20. As in FIG. 44, the laser irradiation generates steplike irregularities on the wall surface 11e of the level difference 11b formed by the surface layer removal process.

Specifically, the steplike wall surface 11e according to the embodiment is formed by gradually decreasing the irradiation power and decreasing the cutting depth during the laser scanning. The steplike wall surface 11e according to the embodiment is also formed by gradually increasing the irradiation power and increasing the cutting depth.

As in the embodiment, applying the unevenness process to the wall surface 11e of the level difference 11b increases the creepage distance between the non-roughened surface 11c and the roughened surface 11a and improves the adhesion of the thermoplastic resin member 20 at the level difference 11b.

The embodiment can also prevent the separation from extending to the roughened surface 11a at the boundary between the roughened surface 11a and the non-roughened surface 11c when the separation occurs at the non-roughened surface 11c of the sealed surface 11 of the thermosetting resin member 10.

The embodiment uses an angle larger than 45 degrees or, favorably, approximately 90 degrees at the corner of each step of the steplike wall surface 11e. This can increase the bend degree of an extension pathway for the separation and favorably prevent the separation.

Sixth Embodiment

Figure 45:
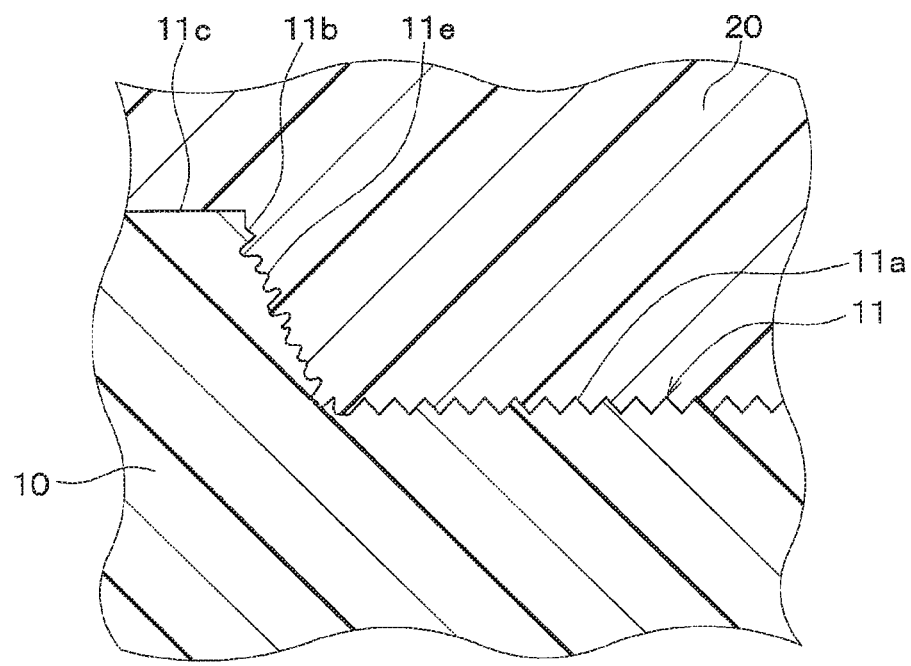
FIG. 45 is a schematic sectional view illustrating a major part of the semiconductor device according to a sixth embodiment of the fourth working example of the disclosure.

With reference to FIG. 45, the description below explains a sixth embodiment of the fourth working example of the disclosure. Similarly to the fifth embodiment of the fourth working example, the sixth embodiment applies the unevenness process to the wall surface 11e at the level difference 11b. However, the embodiment changes the shape of irregularities formed by the unevenness process.

According to the embodiment, as in FIG. 45, the unevenness process uses the laser irradiation to form fine irregularities on the wall surface 11e of the level difference 11b. To form the fine irregularities, low-power laser irradiation is applied to the wall surface 11e of the level difference 11b formed by the surface layer removal process.

The sixth embodiment also applies the unevenness process to the wall surface 11e of the level difference 11b and thereby increases the creepage distance and improves the adhesion of the thermoplastic resin member 20 similarly to the fifth embodiment of the fourth working example. The sixth embodiment provides the effect of preventing the separation from extending similarly to the fifth embodiment of the fourth working example.

The fifth and sixth embodiments of the fourth working example may be combined with the first through fourth embodiments of the fourth working example. The unevenness process described in the fifth and sixth embodiments of the fourth working example may be applied to the wall surface of the level difference 11b according to the first through fourth embodiments of the fourth working example.

Namely, the embodiments provide the groove 11d or an irregularly shaped separation prevention portion between the non-roughened surface 11c and the roughened surface 11a of the sealed surface 11 or on the wall surface 11e of the level difference 11b to decrease the stress intensity factor concerning the separation. The embodiments thereby prevent the separation from extending while bending a separation pathway for the thermoplastic resin member 20 at the boundary, increasing the creepage distance, or improving the adhesion of the thermoplastic resin member.

Other Embodiments

Figure 46:
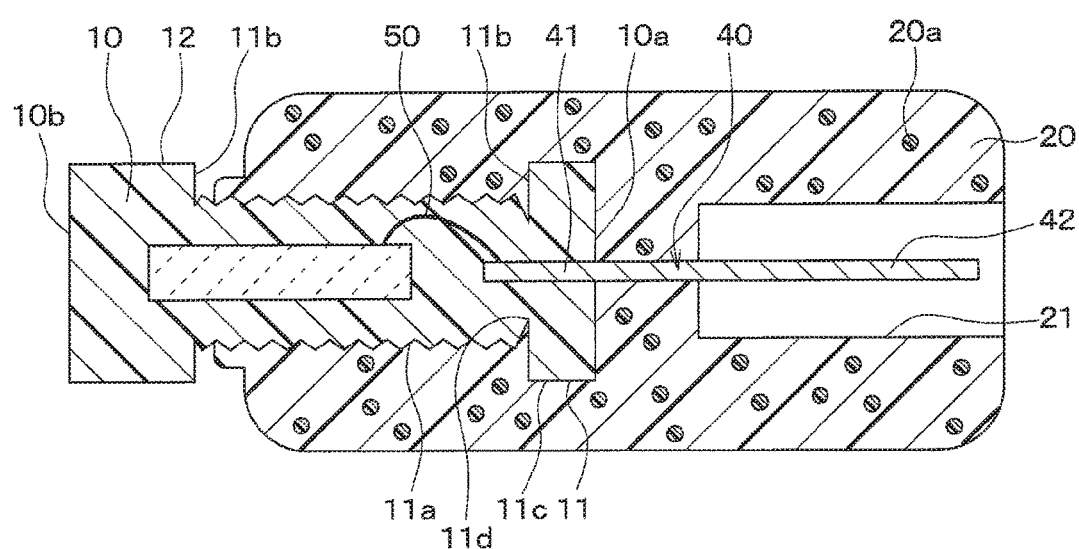
FIG. 46 is a schematic sectional view illustrating a major part of the semiconductor device according to a seventh embodiment of the fourth working example of the disclosure.

The semiconductor device in FIG. 34 includes two boundaries between the roughened surface 11a and the non-roughened surface 11c of the sealed surface 11 of the thermosetting resin member 10. The sealed surface 11 may include at least one boundary or may include three or more boundaries. FIG. 46 illustrates an example of the semiconductor device that includes one boundary.

According to the semiconductor device 30 in FIG. 46, one end (to the right of FIG. 46) of the roughened surface 11a of the thermosetting resin member 10 is located at the sealed surface 11. The other end (to the left of FIG. 46) thereof is located at the exposed surface 12. The one end of the roughened surface 11a corresponds to the boundary between the roughened surface 11a and the non-roughened surface 11c of the sealed surface 11. As described in the embodiments, the groove 11d may be formed or the unevenness process may be performed at the boundary.

The groove 11d just needs to prevent the separation from extending to the roughened surface 11a when the separation occurs at the surface boundary between the non-roughened surface 11c and the thermoplastic resin member 20. The groove 11d is not limited to the shapes described in the embodiments.

The unevenness process applied to the wall surface 11e of the level difference 11b also just needs to prevent the separation from extending to the roughened surface 11a when the separation occurs at the surface boundary between the non-roughened surface 11c and the thermoplastic resin member 20. The unevenness process is not limited to the shapes described in the embodiments.

Generally, the thermoplastic resin member 20 contains the additive 20a and reinforcement fiber such as glass fiber to increase the mechanical strength. In this case, the orientation direction of the reinforcement fiber favorably corresponds to the direction of an extension pathway along which the separation extends to the roughened surface 11a when the separation occurs at the surface boundary between the non-roughened surface 11c and the thermoplastic resin member 20.

A resin flow direction in the injection molding can regulate the orientation direction of the reinforcement fiber in the thermoplastic resin member 20. The flow direction in the injection molding just needs to correspond to the direction of the extension pathway for the separation.

When the thermoplastic resin member 20 contains the reinforcement fiber whose orientation direction is regulated, a linear expansion coefficient for the resin in the orientation direction of the reinforcement fiber is smaller than a linear expansion coefficient for the resin in the direction orthogonal to the orientation direction of the reinforcement fiber. This state of linear expansion coefficients is favorable because the separation occurring at the surface boundary between the non-roughened surface 11c and the thermoplastic resin member 20 hardly extends to the roughened surface 11a.

The first sealed component and the second sealed component just need be able to be sealed by the thermosetting resin member 10. The sealed components are not limited to the semiconductor device 30, the electric connection member 40, or the circuit board as described.

The shape of the thermosetting resin member 10 is not limited to cuboid as described. The thermosetting resin member 10 may be formed into a spherical shape or an indefinite shape. The thermoplastic resin member 20 just needs to satisfy the sealing configuration so that the surface of the thermosetting resin member 10 is partly sealed and the remaining part is exposed. The sealing configuration is not limited to the illustrated example in which one end 10a of the thermosetting resin member 10 provides the sealed surface 11 and the other end thereof provides the exposed surface.

According to the embodiments, the resin molded article is provided as a semiconductor device. The inside of the thermosetting resin member 10 is provided with the semiconductor device 30 as a sealed component sealed with the thermosetting resin member 10. However, the resin molded article is not limited to the semiconductor device. The thermosetting resin member 10 may be configured to be void of the sealed component.

While there have been described the specific preferred working examples or embodiments of the present disclosure, it is to be distinctly understood that the disclosure is not limited to the working examples, embodiments, or structures but may be otherwise variously embodied within the spirit and scope of the disclosure. The disclosure includes various modification examples and modifications within the applicable scope. It is also understood that the scope of the disclosure and the general inventive concept thereof cover preferred combinations and forms or the other combinations and forms including only one element or more or fewer than the same.

The invention claimed is:

1. A manufacturing method of a resin molded article including:
    a thermosetting resin member made of thermosetting resin; and a thermoplastic resin member made of thermoplastic resin to seal a sealed surface as part of a surface of the thermosetting resin member, wherein an exposed surface as a remaining part of the surface of the thermosetting resin member is exposed from the thermoplastic resin member, the manufacturing method comprising:
    completely hardening, by heating, the thermosetting resin material to form the thermosetting resin member into a shape of a cuboid by using a thermosetting resin material as a raw material of the thermosetting resin member;
    removing a surface layer on a topmost surface in at least part of the sealed surface of the thermosetting resin member to form the at least part of the sealed surface as a newly formed surface containing a functional group;
    adding, into a thermoplastic resin material as a raw material of the thermoplastic resin member, a functional group-containing additive containing a functional group that is to be chemically bound to the functional group on the newly formed surface, to prepare a material doped with the functional group-containing additive; and
    plasticizing injection molding by injection molding the material doped with the functional group-containing additive onto the thermosetting resin member formed with the newly formed surface, and
    sealing the sealed surface of the thermosetting resin member with the thermoplastic resin member while chemically binding the functional group on the newly formed surface to the functional group in the functional group-containing additive with which the thermoplastic resin material is doped, wherein
    in the removing of the surface layer, the newly formed surface containing the functional group corresponds to a base for the surface layer and the newly formed surface is a roughened surface that is formed as a closed ring that extends around four sides of the cuboid of the thermosetting resin member.

2. The resin molded article manufacturing method according to claim 1,
    wherein the removing of the surface layer applies laser irradiation onto the at least part of the sealed surface of the thermosetting resin member.

3. The resin molded article manufacturing method according to claim 1,
    wherein:
    the hardening uses a material containing at least one of a hydroxyl group and an epoxide group as a functional group so that the material is provided as a constituent material of the thermosetting resin member; and
    the plasticizing injection molding uses a material containing at least one of a hydroxyl group, an epoxide group, an amino group, and a carbonyl group as a functional group so that the material is provided as a constituent material of the functional group-containing additive.

4. The resin molded article manufacturing method according to claim 1,
    wherein:
    the hardening uses a material containing at least one of a hydroxyl group and an epoxide group as a functional group so that the material is provided as a constituent material of the thermosetting resin member; and
    the plasticizing injection molding uses the functional group-containing additive whose constituent material contains at least one functional group equal to a functional group contained in a constituent material of the thermosetting resin member to covalently bind to a functional group contained in a constituent material of the thermosetting resin member.

5. The resin molded article manufacturing method according to claim 1, wherein
    in the adding of the of the functional group-containing additive into the thermoplastic resin, the material doped with the functional group-containing additive is prepared by kneading a polymer containing the functional group as the functional group containing additive into the thermoplastic resin material as a base material.

6. The resin molded article manufacturing method according to claim 1, wherein
    in the removing of the surface layer, the topmost surface of the thermosetting member includes a mold release agent, which promotes demolding of the thermosetting member and the removing of the surface layer removes the mold release agent and exposes the functional group of the thermosetting resin member.

7. The resin molded article manufacturing method according to claim 2, wherein
    the laser irradiation burns the newly formed surface of the thermosetting member to oxidize the functional group in the thermosetting resin member and stimulate a chemical reaction between the functional group of the thermosetting resin member and the functional group in the functional group-containing additive of the thermoplastic resin member.

* * * * *